United States Patent
Harris et al.

(10) Patent No.: US 11,548,813 B2
(45) Date of Patent: Jan. 10, 2023

(54) GLASS-BASED ARTICLES WITH ENGINEERED STRESS PROFILES AND METHODS OF MANUFACTURE

(71) Applicant: CORNING INCORPORATED, Corning, NY (US)

(72) Inventors: Jason Thomas Harris, Horseheads, NY (US); Vijay Subramanian, Painted Post, NY (US); Chunfeng Zhou, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 462 days.

(21) Appl. No.: 16/479,015

(22) PCT Filed: Jan. 16, 2018

(86) PCT No.: PCT/US2018/013775
§ 371 (c)(1),
(2) Date: Jul. 18, 2019

(87) PCT Pub. No.: WO2018/136384
PCT Pub. Date: Jul. 26, 2018

(65) Prior Publication Data
US 2019/0352225 A1    Nov. 21, 2019

Related U.S. Application Data

(60) Provisional application No. 62/447,569, filed on Jan. 18, 2017.

(51) Int. Cl.
*B32B 7/022*    (2019.01)
*C03C 21/00*    (2006.01)
(Continued)

(52) U.S. Cl.
CPC .......... *C03C 21/002* (2013.01); *B32B 7/022* (2019.01); *B32B 17/06* (2013.01); *G06F 1/1613* (2013.01);
(Continued)

(58) Field of Classification Search
CPC ..... B32B 17/00; B32B 17/06; B32B 2250/03; B32B 2250/40; B32B 2307/536;
(Continued)

(56) References Cited

U.S. PATENT DOCUMENTS 3,737,294 A   6/1973 Dumbaugh et al.
3,931,438 A   1/1976 Beall et al.
(Continued)

FOREIGN PATENT DOCUMENTS

CN   103338926 A   10/2013
CN   104487392 A   4/2015
(Continued)

OTHER PUBLICATIONS

Taiwanese Patent Application No. 107101515, Office Action dated May 7, 2021, 3 pages (English Translation Only) Taiwanese Patent Office.
(Continued)

*Primary Examiner* — Lawrence D Ferguson
(74) *Attorney, Agent, or Firm* — Jeffrey A. Schmidt

(57) ABSTRACT

Laminated glass-based articles and methods of manufacture are disclosed. A glass-based article includes a glass-based substrate having a first surface and a second surface opposing the first surface defining a substrate thickness (t) in a range of about 0.1 millimeters to 3 millimeters, the glass-based substrate having a compressive region having a first compressive stress CS maximum at the first surface of the glass-based article extending to a depth of compression (DOC) and second local CS maximum at a depth of at least
(Continued)

25 μm from the first surface, wherein the glass-based substrate comprises a glass-based core substrate having a first side and a second side, the glass-based core substrate sandwiched between a glass-based first cladding substrate and a glass-based second cladding substrate, the first cladding substrate and second cladding substrate directly bonded to the first side and the second cladding substrate directly bonded to the second side.

20 Claims, 23 Drawing Sheets

(51) Int. Cl.
    *G06F 1/16*         (2006.01)
    *H05K 5/03*         (2006.01)
    *B32B 17/06*       (2006.01)
    *B32B 17/00*       (2006.01)

(52) U.S. Cl.
    CPC ............... *H05K 5/03* (2013.01); *B32B 17/00* (2013.01); *B32B 2250/03* (2013.01); *B32B 2250/40* (2013.01); *B32B 2307/558* (2013.01); *B32B 2307/732* (2013.01); *B32B 2457/20* (2013.01)

(58) Field of Classification Search
    CPC .......... B32B 2307/54; B32B 2307/546; B32B 2307/558; B32B 2307/584; B32B 2307/732; B32B 2419/00; B32B 2457/00; B32B 2457/20; B32B 2605/00; B32B 7/022; C03C 21/002; G06F 1/1613; H05K 5/03
    See application file for complete search history.

(56) References Cited

U.S. PATENT DOCUMENTS

| | | |
|---|---|---|
| 6,284,085 B1 | 9/2001 | Gwo |
| 6,548,176 B1 | 4/2003 | Gwo |
| 7,201,965 B2 | 4/2007 | Gulati et al. |
| 7,514,149 B2 | 4/2009 | Bocko et al. |
| 8,312,739 B2 | 11/2012 | Lee et al. |
| 8,561,429 B2 | 10/2013 | Allan et al. |
| 8,854,623 B2 | 10/2014 | Fontaine et al. |
| 9,193,625 B2 | 11/2015 | Bookbinder et al. |
| 9,522,836 B2 | 12/2016 | Gulati et al. |
| 2011/0200804 A1 | 8/2011 | Tomamoto et al. |
| 2015/0239775 A1 | 8/2015 | Amin et al. |
| 2016/0023945 A1 | 1/2016 | Suzuki et al. |
| 2016/0114564 A1 | 4/2016 | Dejneka et al. |
| 2016/0221863 A1 | 8/2016 | Murata et al. |
| 2016/0279904 A1 | 9/2016 | Sienerth et al. |
| 2017/0282503 A1 | 10/2017 | Peng et al. |
| 2017/0297308 A1 | 10/2017 | Golyatin et al. |
| 2017/0348945 A1 | 12/2017 | Chaussade et al. |

FOREIGN PATENT DOCUMENTS

| | | |
|---|---|---|
| JP | 2014-500847 A | 1/2014 |
| JP | 2014-521582 A | 8/2014 |
| JP | 2015-006959 A | 1/2015 |
| JP | 2015-098412 A | 5/2015 |
| TW | 201623165 A | 7/2016 |
| WO | 2008150355 A1 | 12/2008 |
| WO | 2012/074983 A1 | 6/2012 |
| WO | 2013/016157 A1 | 1/2013 |
| WO | 2016/033038 A1 | 3/2016 |
| WO | 2016/057590 A1 | 4/2016 |

OTHER PUBLICATIONS

International Search Report and Written Opinion of the International Searching Aurthority; PCT/US2018/013775; dated Jun. 29, 2018; 18 Pages; European Patent Office.

Chinese Patent Application No. 201880018843.0, Office Action dated Sep. 3, 2021, 7 pages (3 pages of English Translation and 4 pages of Original Document), Chinese Patent Office.

Japanese Patent Application No. 2019-559000, Decision to Grant dated Jul. 19, 2022, 2 pages (English Translation Only), Japanese Patent Office.

GLASS-BASED ARTICLES WITH ENGINEERED STRESS PROFILES AND METHODS OF MANUFACTURE

CROSS-REFERENCE TO RELATED APPLICATIONS

This application is a national stage entry of International Patent Application Serial No. PCT/US2018/013775, filed on Jan. 16, 2018, which in turn, claims the benefit of priority under 35 U.S.C. § 119 of U.S. Provisional Application Ser. No. 62/447,569 filed on Jan. 18, 2017, the contents of each of which are relied upon and incorporated herein by reference in their entireties.

FIELD

Embodiments of the disclosure generally relate to glass-based articles having engineered stress profiles and methods for manufacturing the same.

BACKGROUND

Strengthened glass-based articles are widely used in electronic devices as cover plates or windows for portable or mobile electronic communication and entertainment devices, such as mobile phones, smart phones, tablets, video players, information terminal (IT) devices, laptop computers, navigation systems and the like, as well as in other applications such as architecture (e.g., windows, shower panels, countertops etc.), transportation (e.g., automotive, trains, aircraft, sea craft, etc.), appliance, or any application that requires superior fracture resistance but thin and lightweight articles.

In strengthened glass-based articles, such as chemically strengthened glass articles, compressive stress is highest or at a peak at the glass surface and reduces from a peak value moving away from the surface, and there is zero stress at some interior location of the glass article before the stress in the glass article becomes tensile. Modifications to ion exchange processes can be used to address sensitivity initial flaw populations in glass-based articles to modify the stress profile of the glass to decrease sensitivity to initial flaw populations. While modifications to ion exchange processes can be used for this purpose, as strengthened glass-based articles are increasingly being utilized, it would be desirable to develop other methods to provide strengthened glass-based materials having improved reliability, while not significantly impacting mean strength of the strengthened glass-based materials.

SUMMARY

Aspects of the disclosure pertain to glass-based articles and methods for their manufacture. In a first aspect, a glass-based article comprising a glass-based substrate having a first surface and a second surface opposing the first surface defining a substrate thickness (t) in a range of about 0.1 millimeters to 3 millimeters, the glass-based substrate having a compressive region having a first compressive stress CS maximum at the first surface of the glass-based article extending to a depth of layer (DOL) and second local CS maximum at a depth of at least 25 μm from the first surface.

In another aspect, a method of manufacturing a glass-based article comprises bonding a glass-based first cladding substrate to a first side of a chemically strengthened glass-based core substrate without a polymer or adhesive, bonding a glass-based second cladding substrate to a second side of the chemically strengthened glass-based core substrate without a polymer or adhesive, and chemically strengthening the first cladding substrate and the second cladding substrate.

BRIEF DESCRIPTION OF THE DRAWINGS

The accompanying figures, which are incorporated in and constitute a part of this specification, illustrate several embodiments described below.

DETAILED DESCRIPTION

Figure 1:
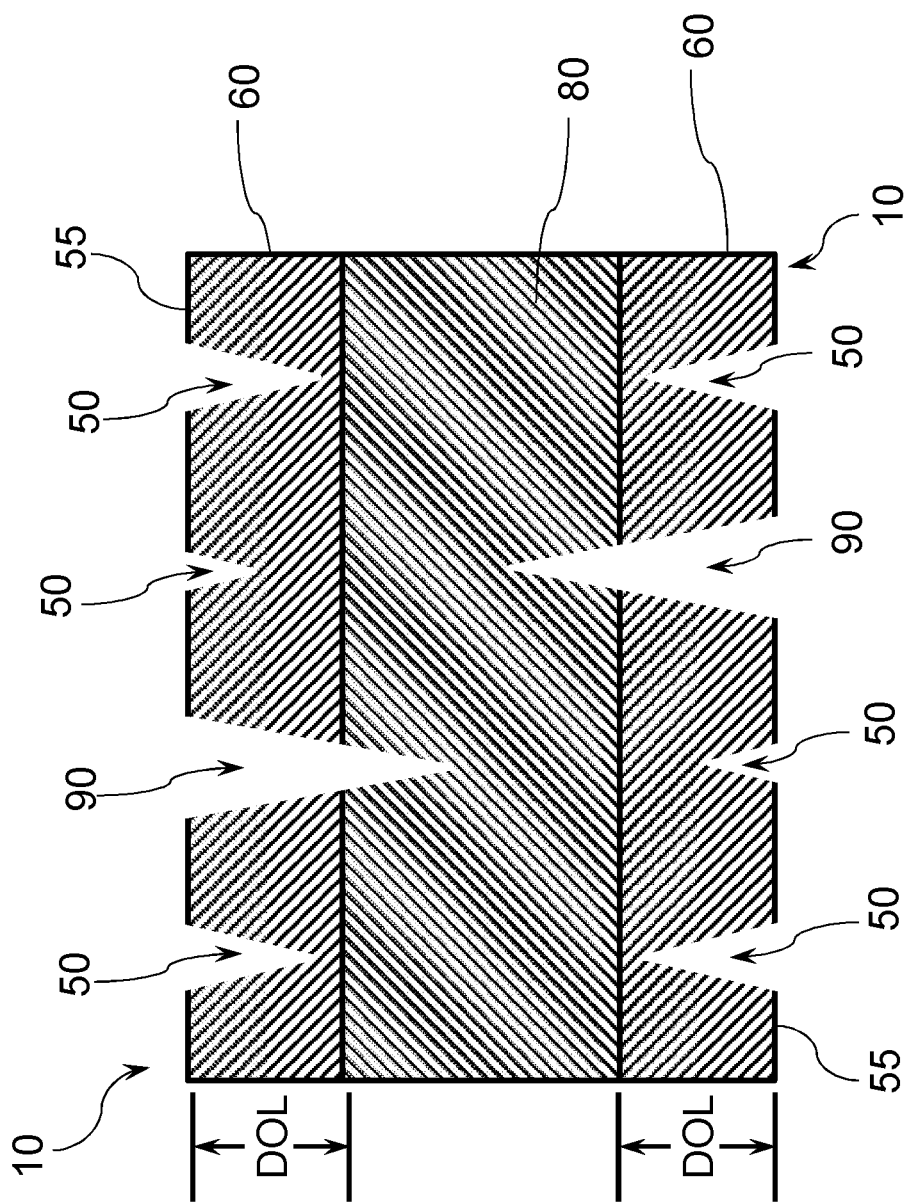
FIG. 1 illustrates an embodiment of a glass-based substrate with a surface having a plurality of cracks.

Before describing several exemplary embodiments, it is to be understood that the disclosure is not limited to the details of construction or process steps set forth in the following disclosure. The disclosure provided herein is capable of other embodiments and of being practiced or being carried out in various ways.

Reference throughout this specification to "one embodiment," "certain embodiments," "various embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in various embodiments," "in one embodiment" or "in an embodiment" in various places throughout this specification are not necessarily referring to the same embodiment. Furthermore, the particular features, structures, materials, or characteristics may be combined in any suitable manner in one or more embodiments.

One or more embodiments of the disclosure provide laminated glass-based articles including a glass-based substrate having an engineered stress profile. In one or more embodiments laminated glass-based articles are provided that include designed stress profiles that provide resistance to failure due to deep damage. In one or more embodiments, the laminated glass-based articles are not bendable.

Laminated glass-based articles are disclosed, the articles having optimized stress profiles against deep flaws. In some embodiments, the optimized stress profiles improve the glass-based article drop performance by improving the retained strength for deep flaws, for example, flaws greater than 100 microns, while also having sufficient flexural strength due to a high compressive stress at the surface. In one or more embodiments, the optimized drop performance is due to a specially designed stress profile which creates high compressive stress at regions where the flaws due to damage introduction are expected to terminate. In one or more embodiments, the laminated glass-based articles exhibit a compressive stress profile in which there is a steeper tangent at or near the surface (i.e., a spike in the stress profile at the surface). The stress profile of one or more embodiments features the presence of two distinct regions having tangents within certain ranges—one with a relatively steep tangent and one with a shallow tangent.

In one or more embodiments, optimized stress profiles can significantly increase glass-based article's strength protection against deep flaws (for example, greater than 70 µm, greater than 80 µm, greater than 90 µm, greater than 100 µm, greater than 110 µm, greater than 120 µm, greater than 130 µm, greater than 140 µm, greater than 150 µm, greater than 160 µm, greater than 170 µm, greater than 180 µm, greater than 190 µm, greater than 200 µm, greater than 210 µm, greater than 220 µm, greater than 230 µm, greater than 240 µm, and greater than 250 µm) to improve its mechanical reliability against drop-induced damage compared to profiles obtained by standard single ion exchange strengthening or lamination. In one or more embodiments, optimized stress profiles can also have comparable flexural strength behavior against shorter flaws (for example, less than 10 µm). In one or more embodiments, optimized stress profiles can be created to provide better stress corrosion resistance against deep flaws (for example, greater than 70 µm, greater than 80 µm, greater than 90 µm, greater than 100 µm, greater than 110 µm, greater than 120 µm, greater than 130 µm, greater than 140 µm, greater than 150 µm, greater than 160 µm, greater than 170 µm, greater than 180 µm, greater than 190 µm, greater than 200 µm, greater than 210 µm, greater than 220 µm, greater than 230 µm, greater than 240 µm, and greater than 250 µm).

According to one or more embodiments, optimized stress profiles can be achieved through a lamination process. Profiles can be created by laminating glass-based substrates to both sides of a core substrate having an ion exchange profiles to provide a laminate stack, and then ion exchanging the laminate stack to provide the laminated glass-based substrates. The laminated glass-based substrate has tension on cladding glass and compression on core glass that is opposite to conventional laminated glass. The relative ion diffusivities of the core and cladding can provide another way to control stress profiles in glass-based articles.

Damage associated with drop events can cause chipping and densification near the surface of glass-based substrates, which, for error function profiles, coincides with the highest residual compressive stress. According to one or more embodiments, buried peak profiles can be obtained, wherein the stress is buried and unaffected by much of the surface damage caused during drop events on rough surfaces.

In one or more embodiments, the compositions of the core and clad glass-based substrates can be the same or different, which can permit the integration of new design features and applications. According to one or more embodiments, different compositions of the core and clad glass substrates can be utilized to further increase the deep damage fracture resistance of the glass-based substrate, for instance, by utilizing a coefficient of thermal expansion (CTE) difference to create compressive stress in the clad layers, resulting in improved rough surface drop performance. In one or more embodiments, the thickness of the clad glass-based substrate can be varied to precisely locate the depth of a buried peak of a stress profile. As used herein, "buried peak" with reference to a stress profile refers to a localized maximum on a stress versus depth from surface of the glass plot, where the localized maximum or peak has a higher stress magnitude of compressive stress than a point between the buried peak and the exterior surface of a glass-based article.

In one or more embodiments, the core and clad substrate properties, such as ion diffusivity, can be selected to precisely control the distribution of the buried peak and surface compression residual stresses of the glass-based articles. For example, a low ion diffusivity core and high ion diffusivity clad will result in a buried peak that is similar to a standard ion exchange error function profile, however, according to one or more embodiments, the glass articles described herein are different in that there is a greater degree of flexibility in designing stress profiles and tunability of stress profiles compared to existing profiles. Use of glass substrates with different ion diffusivities can control characteristics of the buried peak such as stress magnitude and CS depth. In one or more embodiments, a sensor layer can be incorporated into the ion exchanged stack of substrates.

In one or more embodiments, glass-based articles having optimized stress profiles against deep flaws to improve cover glass's drop performance without sacrificing flexural strength small and large flaws (less than 10 µm and greater than 75 µm) are provided. Also provided are methods of obtaining optimized stress profiles against deep flaws to improve cover glass's drop performance.

In one or more embodiments, glass articles are provided having optimized stress profile for drop, scratch, and flexural performance and a method to produce such a profile. In an embodiment, an optimized profile can be created through a combination of ion exchanges and bonding thin glass-based cladding substrates to a core substrate by covalent bonding. In one or more embodiments, a method of creating such optimized profiles can include selecting a glass substrate having a predetermined composition to provide the core substrate of the laminated glass-based article. The predetermined composition is chosen according to one or more embodiments in view of several downstream processes that will change the profile magnitude and shape, which will be discussed in more detail later. In one or more embodiments, the core substrate is chemically strengthened, and the resulting stress profile is also predetermined in terms of magnitude of stress at the surface and depth of stress layer. In one or more embodiments, two cladding substrates that are in a range of about 50 to 150 µm thick and having a predetermined thickness and composition, are bonded to the core substrate. In one or more embodiments, the cladding substrates can be bonded to the core substrate by covalent bonding.

In one or more embodiments, the high temperatures to form covalent bonds may cause additional ion diffusion within the ion exchanged core substrate, which will lower the magnitude of the stress, but increase the depth of the stress. It is also possible that the sodium and potassium ions in the core substrate may diffuse into the clad glass, but the modeling used herein has assumed that the interface between the core and cladding was non-permeable. After bonding, the entire laminated article is again ion exchanged to create compressive stresses in the thin cladding substrates. The stress profile will impart flexural strength to the laminated glass article. The second ion exchange will reduce the magnitude of the core ion exchange and will further increase its depth due to diffusion and the total energy stored will be maintained.

Figure 4:
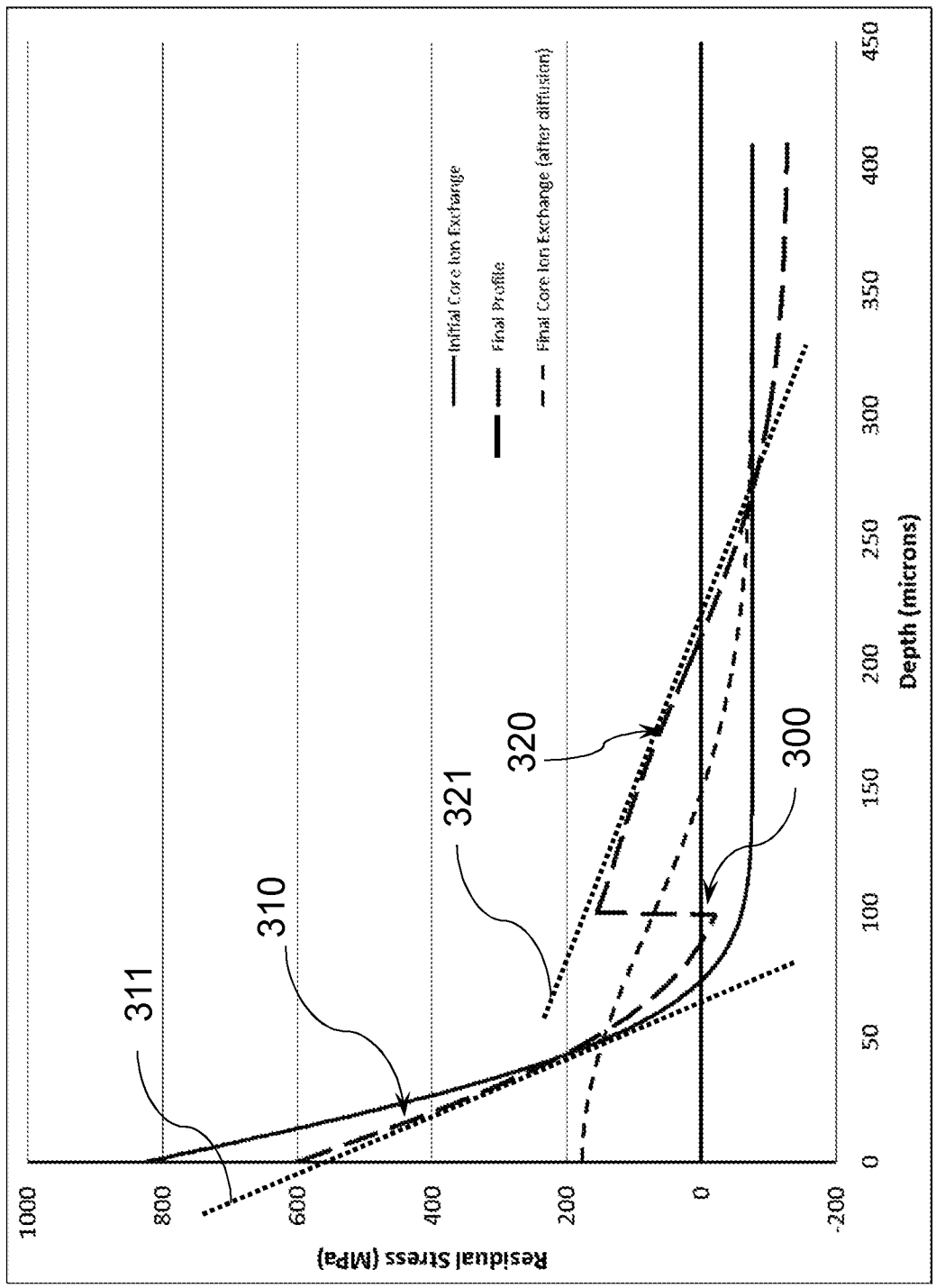
FIG. 4 illustrates a modelled stress profile of a laminated glass-based article.

FIG. 4 illustrates the various stress profile at the stages of the process for forming the laminated glass-based articles according to one or more embodiments. The solid line shows a chemically strengthened core substrate exemplary stress profile shown. Two layers of glass cladding substrates, each having the same thickness and composition are bonded to the surfaces of the chemically strengthened core glass substrate. The composition of the cladding glass substrates can be different than the core glass, and thickness of the cladding glass substrates will generally be thinner than the core glass substrate. The entire laminated glass article is then chemically strengthened, resulting in an exemplary stress profile such as the one shown in by the long dashed line. Thermal processing to bond the substrates changes the stress profile of the core glass substrate shown by solid line to the stress profile represented by the small dashed line due to non-permeable boundary layer diffusion. The final stress profile is the superposition of the small dashed line with the ion exchange profile that was applied to the outer layers. The stress profile includes a first portion 310 where all points comprise a relatively steep tangent 311 close to the surface and second portion 320 where all points comprise a relatively shallow tangent 321 compared to the steep tangent 311. In one or more embodiments, the first portion comprising the steep tangent 311 and the second portion comprising the relatively shallow tangent 321 is such that there is a ratio of the relatively steep tangent to the relatively shallow tangent 321 of greater than 1, greater than 2, greater than 4, greater than 8, greater than 10, greater than 15, greater than 20, greater than 25, greater than 30, or greater than 35 and less than 40. In one or more embodiments, the first portion relatively steep tangent 311 has an absolute value in a range of 3 MPa/micron and 40 MPa/micron, and the second portion relatively shallow tangent 321 has an absolute value in a range of 0.5 MPa/micron and 2 MPa/micron. In some embodiments, the tangent may be described and used interchangeably with "local gradient," which is defined as the change in stress magnitude as a function of depth.

In one or more embodiments, the glass-based article has a stress profile that does not follow a single complementary error function. The example shown in FIG. 4 is based on a 1.0 mm in total thickness, with the cladding substrates each being 100 µm thick, and the core substrate being 800 µm thick.

In one or more embodiments, a process to bond the core substrate to the cladding substrates can include cleaning the surfaces of the core substrate and cladding substrates with a high pH solution. For example, what is known as a RCA clean or SC1 process may be used. In one or more embodiments, a RCA clean process includes removal of organic contaminants (organic clean+particle clean), removal of a thin oxide layer (oxide strip, optional) and removal of ionic contamination (ionic clean). The substrates can be soaked in water, such as deionized water, and rinsed with water between each step. In one or more embodiments, the cleaning can include only a SC1 (referring to a standard clean process) process, which involves cleaning the substrates a solution of deionized water and aqueous ammonium hydroxide (for example, 29% by weight $NH_3$) and hydrogen peroxide (for example, 30%). An exemplary SC1 solution can include 5 parts (by volume) water, 1 part ammonium hydroxide and 1 part aqueous hydrogen peroxide. The cleaning can occur at room temperature (for example, about 25° C.), or an elevated temperature in a range of 50° C. to 80° C. The substrates can be placed in the solution for 1 minute to 30 minutes. This solution cleaning removes organic residues and particles.

According to one or more embodiments, in addition to the SC1 process, an optional oxide strip may be performed. This oxide strip, according to one or more embodiments, includes immersion in a 1:100 or 1:50 solution of aqueous HF hydrofluoric acid at a temperature in a range of from 25° C. to 80° C. for a period of time of from about fifteen seconds to about 5 minutes, in order to remove a thin oxide layer and some fraction of ionic contaminants. In one or more embodiments, a third step includes an ionic clean. In an exemplary embodiment, a solution of water (e.g., deionized water), aqueous HCl (hydrochloric acid, for example 37% by weight) and aqueous hydrogen peroxide (for example, 30% by weight) is provided. An example of solution is 6 parts (by volume) deionized water, 1 part HCl and 1 part hydrogen peroxide. The substrates are placed in a solution at room temperature (for example, about 25° C.), or at an elevated temperature in a range of 50° C. to 80° C. The substrates can be placed in the solution for 1 minute to 30 minutes. This ionic cleaning treatment effectively removes the remaining traces of metallic (ionic) contaminants, some of which were introduced in the SC-1 cleaning step. In an optional step, the substrates can be rinsed in water (such as deionized water) and then placed in a stack and heated to a temperature exceeding about 400° C. for about an hour with continued applied pressure. The resulting laminated glass-based article will comprise the cladding substrates and the core substrate bonded together. After lamination, the entire laminated glass article is ion exchanged to create compressive stresses in the thin layers of cladding substrates. According to one or more embodiments, the resulting stress profile will impart flexural strength to the laminated glass-based article. The ion exchange of the laminated glass-based article according to some embodiments will reduce the magnitude of the core ion exchange and will further increase its depth due to diffusion and the total energy stored will be maintained.

As used herein, the terms "glass-based article" and "glass-based substrates" are used in their broadest sense to include any object made wholly or partly of glass. Glass-based articles include laminates of glass and non-glass materials, laminates of glass and crystalline materials, and glass-ceramics (including an amorphous phase and a crystalline phase). Unless otherwise specified, all compositions are expressed in terms of mole percent (mol %). Glass substrates according to one or more embodiments can be selected from soda lime glass, alkali aluminosilicate glass, alkali containing borosilicate glass and alkali aluminoborosilicate glass. In one or more embodiments, the substrate is a glass, and the glass can be strengthened, for example, heat strengthened, tempered glass, or chemically strengthened glass. In one or more embodiments, strengthened glass-based substrates have a compressive stress (CS) layer with a CS extending within the chemically strengthened glass from a surface of the chemically strengthened glass to a compressive stress depth of compression (DOC) of at least 10 μm to several tens of microns deep. In one or more embodiments, the glass-based substrate is a chemically strengthened glass-based substrate such as Corning Gorilla® glass. The various glass-based articles described herein can be selected from an architectural glass substrate, a vehicle glazing, a vehicle interior glass substrate, an appliance glass substrate, a hand-held device glass substrate, and a wearable device glass substrate.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. Thus, for example, a glass-based article that is "substantially free of MgO" is one in which MgO is not actively added or batched into the glass-based article, but may be present in very small amounts as a contaminant.

As used herein, DOC refers to the depth at which the stress within the glass-based article changes compressive to tensile stress. At the DOC, the stress crosses from a positive (compressive) stress to a negative (tensile) stress and thus exhibits a stress value of zero.

As used herein, the terms "chemical depth", "chemical depth of layer" and "depth of chemical layer" may be used interchangeably and refer to the depth at which an ion of the metal oxide or alkali metal oxide (e.g., the metal ion or alkali metal ion) diffuses into the glass article and the depth at which the concentration of the ion reaches a minimum value.

According to the convention normally used in the art, compression is expressed as a negative (<0) stress and tension is expressed as a positive (>0) stress. Throughout this description, however, CS is expressed as a positive or absolute value—i.e., as recited herein, CS=|CS|.

FIG. 1 illustrates an exemplary strengthened glass-based substrate 10 having a plurality of cracks, illustrating how subsurface damage can result in a failure. Compressive stress regions 60 extending from an outer surface 55 of the glass-based substrate 10 to a depth of compression (DOC) is under a compressive stress (CS). Cracks 50 in the compressive stress region 60 of the exemplary strengthened glass-based substrate 10 that do not extend into the central tension region 80 of the glass are shown, along with cracks 90 that penetrate into the central tension regions 80 of the glass, which are regions under tensile stress or central tension (CT). Although the incorporation of a CS in a near surface region of the glass can inhibit crack propagation and failure of the glass-based substrate, if the damage extends beyond the DOC, and if the CT is of a high enough magnitude, the flaw will propagate over time until it reaches the materials critical stress intensity level (fracture toughness) and will ultimately fracture the glass.

Figure 2:
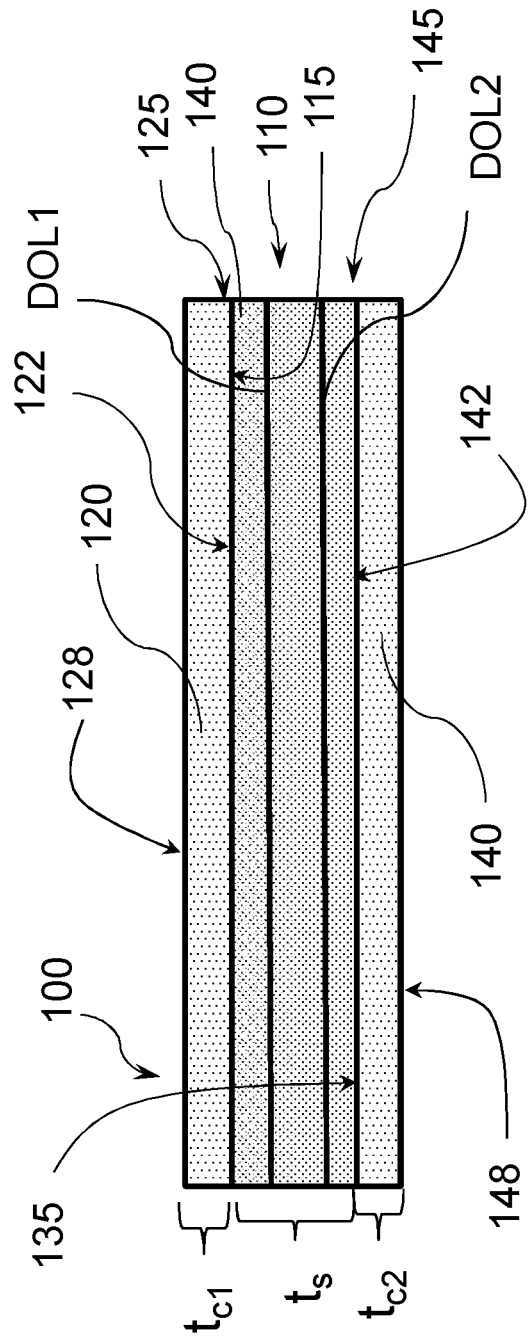
FIG. 2 illustrates an embodiment of a laminated glass-based article.

Referring now to FIG. 2, a first embodiment of the disclosure pertains to a laminated glass-based article 100, comprising a strengthened glass-based substrate 110 having a first surface 115 and a second surface 135. The strengthened glass-based substrate 110 in one or more embodiments is chemically strengthened, or thermally strengthened or chemically and thermally strengthened. The laminated glass-based article 100 further comprises a chemically strengthened glass-based first cladding substrate 120 having a third surface 122 directly bonded to the first surface to provide a first core-cladding interface 125. The laminated glass-based article 100 further comprises a chemically strengthened glass-based second cladding substrate 140 having a fourth surface 142 directly bonded to the second surface 135 to provide a second core-cladding interface 145. According to one or more embodiments, the core substrate 110 is bonded to the first cladding substrate 120 and the second cladding substrate 140 without a polymer between the core substrate 110 and the first cladding substrate 120 and without a polymer between the core substrate 110 and the second cladding substrate 140. Thus, according to one or more embodiments, "directly bonded" refers to a bond in which there is no additional bonding material such as an adhesive, epoxy, glue, etc. bonding the first cladding substrate 120 and the second cladding substrate 140 to the core substrate 110. In a second embodiment, the first cladding substrate 120 and the second cladding substrate 140 are each bonded to the core substrate 110 by covalent bonding. According to one or more embodiments, covalent bonding is a bond that is a molecular bond that is a chemical bond that involves sharing of electron pairs, which are known as shared pairs or bonding pairs. According to one or more embodiments, covalent bonding may include σ-bonding, π-bonding, metal-to-metal bonding, agostic interactions, bent bonds, and three-center two-electron bonds. In a third embodiment, the covalent bond comprises bond comprises a Si—O—Si bond.

The first cladding substrate 120 is shown as having a thickness $t_{c1}$, the second cladding substrate 140 is shown as having a thickness $t_{c2}$, and the core substrate 110 has a thickness of $t_s$. The thickness of the laminated glass-based article 100 is thus the sum of $t_{c1}$, $t_{c2}$, and $t_s$. In a fourth embodiment, the laminated glass-based article of the first through third embodiments has a thickness in a range of 0.1 mm and 3 mm. In a fifth embodiment, in the laminated glass-based article of the first through fourth embodiments, the first cladding substrate 120 and the second cladding substrate 140 each has a thickness in a range of 25 μm and 150 μm. In a sixth embodiment, in the laminated glass-based article of the first through fifth embodiments, the first cladding substrate 120 and the second cladding substrate 140 each has a thickness in a range of 50 μm and 150 μm. In a seventh embodiment, in the laminated glass-based article of the first through sixth embodiments, the first cladding substrate 120 and the second cladding substrate 140 each has a thickness in a range of 50 μm and 100 μm. In an eighth embodiment, in the laminated glass-based article of the first through seventh embodiments, the first cladding substrate 120 and the second cladding substrate 140 each has a thickness in a range of 50 μm and 75 μm. In a ninth embodiment, in the laminated glass-based article of the first through eighth embodiments, the first cladding substrate 120 and the second cladding substrate 140 each has a thickness in a range of 25 μm and 75 μm.

In a tenth embodiment, in the laminated glass-based article of the first through ninth embodiments, the core substrate 110 comprises a chemically strengthened first glass composition and the first cladding substrate 120 and second cladding substrate 140 each comprises a second glass composition, wherein the first glass composition is different from the second glass composition. In an eleventh embodiment, in the laminated glass-based article of the tenth embodiment, the first glass composition has a first ion diffusivity and the second glass composition each has a second ion diffusivity, and the first ion diffusivity and second ion diffusivity are different. In an twelfth embodiment, in the laminated glass-based article of the tenth and eleventh embodiments, first glass composition has a first coefficient of thermal expansion (CTE) and the second glass composition each has a second coefficient of thermal expansion (CTE), and the first CTE and second CTE are different. In an thirteenth embodiment, in the laminated glass-based article of the tenth and eleventh embodiments, the second CTE is lower than the first CTE to impart a compressive stress in the first cladding substrate and the second cladding substrate. In a fourteenth embodiment, in the laminated glass-based article of the tenth and eleventh embodiments, the second CTE is higher than the first CTE to impart a tensile stress in the first cladding substrate and the second cladding substrate.

In a fifteenth embodiment, in the laminated glass-based article of the first through fourteenth embodiments, the core substrate 110 has a first stress profile and the first cladding substrate 120 and second cladding substrate 140 each has a second stress profile, wherein the first stress profile is different from the second stress profile. In a sixteenth embodiment, in the laminated glass-based article of the tenth through fifteenth embodiments, the first glass composition has a first Young's modulus value and the second glass composition has a second Young's modulus value, and the first Young's modulus value and the second Young's modulus value are different. In a seventeenth embodiment, the second Young's modulus value of the sixteenth embodiment is greater than the first Young's modulus value.

In an eighteenth embodiment, in the laminated glass-based article of the first through seventeenth embodiments, the first cladding substrate 120 has a fifth surface 128 and the second cladding 140 has a sixth surface 148, the fifth surface 128 and sixth surface 148 defining a substrate thickness (t) in a range of about 0.1 millimeters to 3 millimeters, the glass-based article having a compressive stress profile with a first maximum at the fifth surface 128, and a second local maximum at a depth of at least 25 μm from the fifth surface 128. In a nineteenth embodiment, in the laminated glass-based article of the eighteenth embodiment, the glass-based article has a stress profile that does not follow a single complementary error function. In a twentieth embodiment, in the laminated glass-based article of the eighteenth embodiment and nineteenth embodiments, the glass-based article has a stress profile defining a first tangent that is steep and a second tangent that is shallow relative to the first tangent. In a twenty-first embodiment, in the laminated glass-based article of the eighteenth embodiment through twentieth embodiments, the first maximum is greater than the second local maximum. In a twenty-second embodiment, in the laminated glass-based article of the eighteenth embodiment through twenty-first embodiments, the second local maximum is at a depth of at least 25 μm from the fifth surface. In a twenty-third embodiment, in the laminated glass-based article of the eighteenth embodiment through twenty-first embodiments, the second local maximum is at a depth of at least 75 μm from the fifth surface. In a twenty-fourth embodiment, in the laminated glass-based article of the eighteenth embodiment through twenty-first embodiments, the second local maximum is at a depth of at least 100 μm from the fifth surface.

Figure 3:
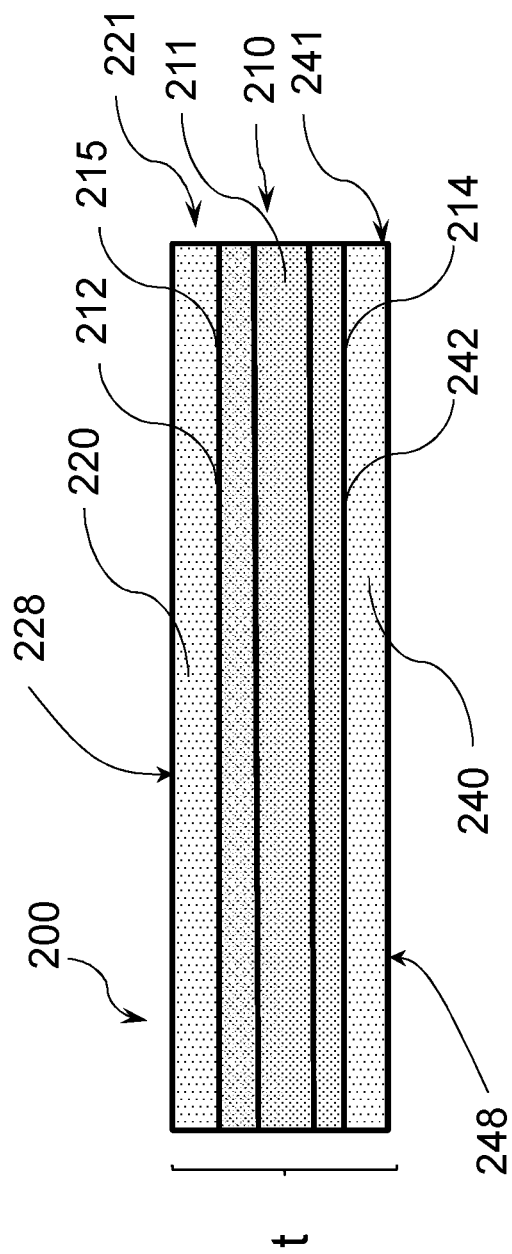
FIG. 3 illustrates another embodiment of a laminated glass-based article.

A twenty-fifth embodiment pertains to a glass-based article 200 as shown in FIG. 3, which comprises a glass-based substrate 210 having a first surface 228 and a second surface 248 opposing the first surface defining a substrate thickness (t) in a range of about 0.1 millimeters to 3 millimeters, the glass-based substrate having a compressive region 220 having a first compressive stress CS maximum at the first surface 218 of the glass-based article extending to a depth of layer 215 and second local CS maximum at a depth of at least 25 μm from the first surface 228. In one or more embodiments, the glass-based article of the twenty-fifth embodiment has a second compressive region 240 having a third compressive stress CS maximum at the second surface 248 of the glass-based article extending to a depth of layer 242 and second local CS maximum at a depth of at least 25 μm from the second surface 248. In a twenty-sixth embodiment, the glass-based article of the twenty-fifth embodiment has a thickness in a range of 0.1 mm and 2 mm.

In a twenty-seventh embodiment, in the glass-based article of the twenty-fifth and twenty-sixth embodiments, the second CS maximum is at a depth of at least 50 μm from the first surface. In a twenty-eighth embodiment, in the glass-based article of the twenty-fifth and twenty-sixth embodiments, the second CS maximum is at a depth of at least 75 μm from the first surface. In a twenty-ninth embodiment, in the glass-based article of the twenty-fifth and twenty-sixth embodiments, the second CS maximum is at a depth of at least 100 μm from the first surface.

Referring now to FIG. 3, in a thirtieth embodiment, the glass-based substrate of the twenty-fifth through twenty-ninth embodiments comprises a glass-based core substrate 211 having a first side 212 and a second side 214, the glass-based core substrate 211 is sandwiched between a glass-based first cladding substrate 221 and a glass-based second cladding substrate 241, the first cladding substrate 221 and second cladding substrate 241 bonded to the first side 212 and the second cladding substrate 241 bonded to the second side 214 by a direct covalent bond. In a thirty-first embodiment, in the glass-based article of the thirtieth embodiment, the core substrate 211 comprises a first glass composition and the first cladding substrate 221 and the second cladding substrate 241 each comprises a second glass composition, wherein the first glass composition is different from the second glass composition. In a thirty-second embodiment, the glass-based article of the thirty-first embodiment is such that the first glass composition has a first ion diffusivity and the second glass composition each has a second ion diffusivity, and the first ion diffusivity and second ion diffusivity are different.

In a thirty-third embodiment, the glass-based article of the thirty-first and thirty-second embodiments is such that the first glass composition has a first coefficient of thermal expansion (CTE) and the second glass composition each has a second coefficient of thermal expansion (CTE), and the first CTE and second CTE are different. In a thirty-fourth embodiment, the glass-based article of the thirty-third embodiment is such that the second CTE is lower than the first CTE to impart a compressive stress in the first cladding substrate and second cladding substrate. In a thirty-fifth embodiment, the glass-based article of the thirty-second through thirty-fourth embodiments is such that the core substrate 211 has a first stress profile and the first cladding substrate 221 and second cladding substrate 241 each has a second stress profile, wherein the first stress profile is different from the second stress profile.

In a thirty-sixth embodiment, the first through thirty fifth embodiments are such that the first glass composition has a first Young's modulus value and the second glass composition has a second Young's modulus value, and the first Young's modulus value and second Young's modulus value are different. In a thirty-eighth embodiment, the thirty-seventh embodiment glass article is such that the second Young's modulus value is greater than the first Young's modulus value. In a thirty-eighth embodiment, the thirty-seventh embodiment glass article is such that the second Young's modulus value is less than the first Young's modulus value, which provides a glass-based article that has higher strength for shorter flaws.

A thirty-ninth embodiment pertains to a method of manufacturing a glass-based article comprising bonding a glass-based first cladding substrate to a first side of a chemically strengthened glass-based core substrate without a polymer or adhesive; bonding a glass-based second cladding substrate to a second side of the chemically strengthened glass-based core substrate without a polymer or adhesive; and chemically strengthening the first cladding substrate and the second cladding substrate. The resulting glass-based article can be the article shown in FIG. 2 or FIG. 3. In a forty-first embodiment, chemically strengthening the first cladding substrate is performed after bonding the first cladding to the core substrate and chemically strengthening the second cladding substrate is performed after bonding the second cladding substrate to the core substrate. In a forty-second embodiment, the forty-first embodiment is such that the core substrate has a first bonding surface and a second bonding surface opposite the first bonding surface, the first cladding substrate having a third bonding surface and the second cladding substrate having a fourth bonding surface, the method further comprising cleaning the core substrate, the first cladding substrate and the second cladding substrate to provide hydroxyl groups on the first bonding surface, the second bonding surface, the third bonding surface and the fourth bonding surface; and placing the first bonding surface in contact with the third bonding surface and placing the third bonding surface in contact with the fourth bonding surface to provide a laminate stack. In the forty-first embodiment, the first bonding surface is the first surface 115 shown in FIG. 2 and the second bonding surface is the second surface 135. The third bonding surface is the third surface 122 and the fourth bonding surface is the fourth surface 142. In a forty-second embodiment, the thirty-ninth through forty-first embodiment includes heating the laminate stack. Heating can be achieved by heating the laminate stack in an oven or other heating device, or applying local heat by laser, a flame or other heating device such as resistive heaters. In a forty-third embodiment, the forty-second embodiment includes heating to a temperature and for a time sufficient to form a covalent bond between the first bonding surface and the third bonding surface and a covalent bond between the second bonding surface and the fourth bonding surface. In a forty-fourth embodiment, the forty-third embodiment includes heating the laminate stack to a temperature of at least about 400° C. for a period of time of at least 30 minutes. In a forty-fifth embodiment, the forty-fourth embodiment includes chemically strengthening the first cladding substrate and the second cladding substrate.

Figure 5A:
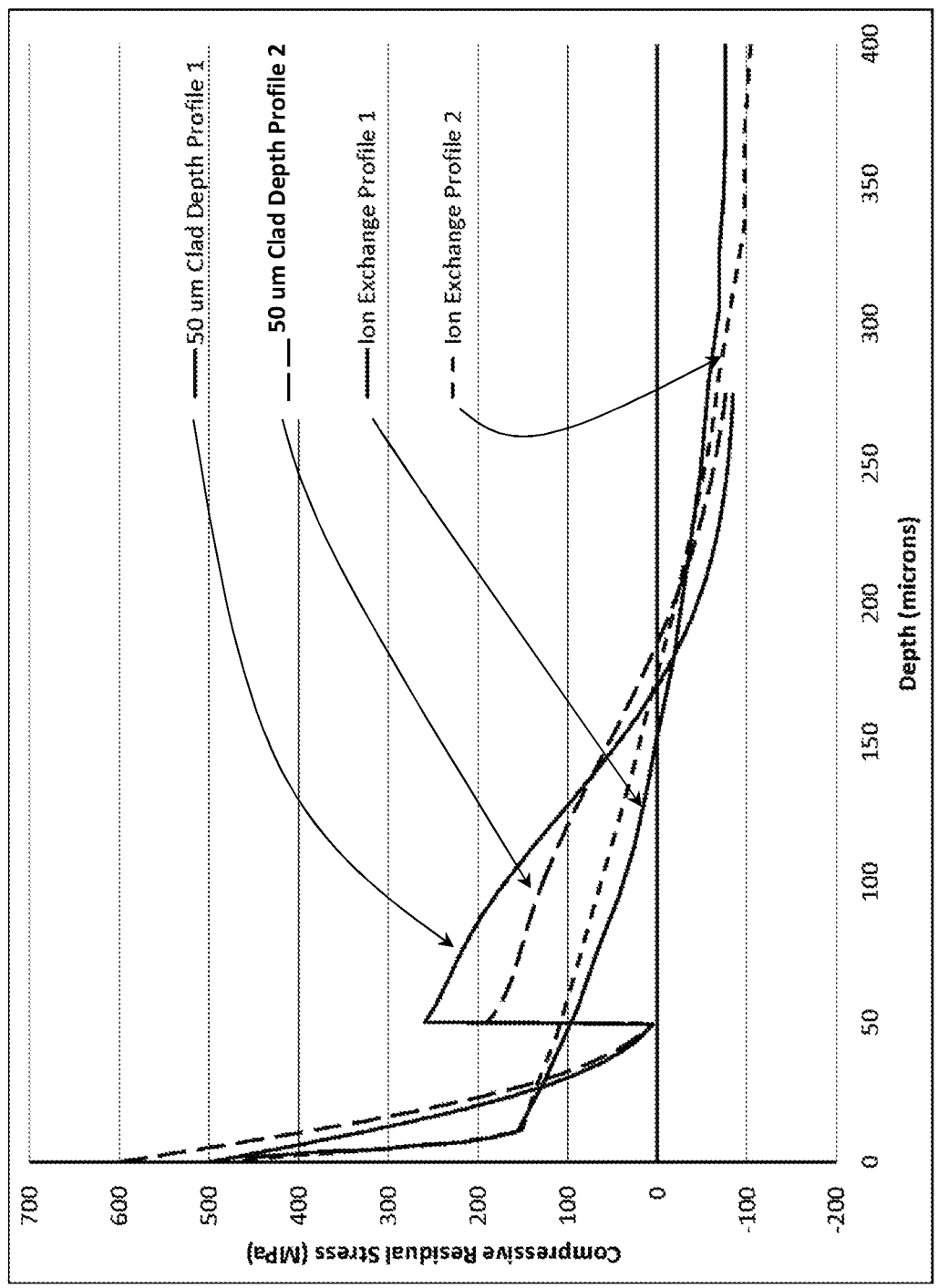
FIG. 5A illustrates a modelled stress profile of a laminated glass-based article.

Two exemplary profiles in accordance with embodiments of the disclosure are shown in FIG. 5A. The stress profiles provided in the Figures herein were simulated using finite element modeling and fracture mechanics. In the simulations, the residual stress profile was applied to the glass-based article, a crack was explicitly inserted, four-point bending was applied to the geometry with the surface crack on the tensile side of the glass-based article, and stress intensity factors were calculated using the focused mesh approach. The strength of the plate in plane strain as a function of flaw size was then plotted. Two possible profiles generated by bonding 50 µm clads onto 800 µm substrates are shown in FIG. 5A.

The initial ion exchange profile of the core substrate is selected based upon the understanding that the bonding and second ion exchange steps will decrease the magnitude of the CS of the core glass substrate at the surface, but will also increase the depth. While not being bound by any theory, it is expected that a single ion exchange (e.g., potassium for sodium ions) will impart the desired stress profile characteristics, though additional optimization of the profile may be performed. In embodiments in which the transformation of the initial ion-exchange profile of the core substrate that occurs during bonding and ion-exchange of the laminated stack is to be minimized, then a core glass-based substrate with low diffusivity for potassium ions is selected. In alternative embodiments in which a deeper depth of compression in the core substrate is sought to be obtained, then a glass with high diffusivity for potassium ions is selected for the core glass-based substrate. In an embodiment, a high diffusivity glass contains lithium. High diffusivity glasses for the cladding substrates are selected to reduce the time of the ion-exchange the ion exchange of the laminated stack. The resultant stress profile according to one or more embodiments has a sufficient magnitude to arrest deep damage introduced during drop events that are coincident in time with global device flexure, and also be at the correct depth to capture most of the damage. In one or more embodiments, additional thermal treatments can be applied to increase the depth of the core stress profile, and in some embodiments, the cladding substrates.

Thus, according to one or more embodiments, the glass-based articles provide a variety of ways to tune the stress profile of the glass-based article, thereby providing a high degree of stress profile tunability. Parameters that can be varied to tune the final stress profile of the glass-based articles include the stress profile shape of the core glass substrate, thermal processing critical, and the thicknesses of the cladding substrates. In one or more embodiments, the clad substrate thickness determines the beginning of the buried CS. In one or more embodiments, the ion exchange of the laminated glass stack is tailored to provide sufficient resistance to breakage from drops and flexural strength. In addition, according to one or more embodiments, an ion exchange spike can be applied at the surface to impart the desired flexural strength. The ion exchange of the laminated glass could also be tailored to provide scratch resistance.

Figure 5B:
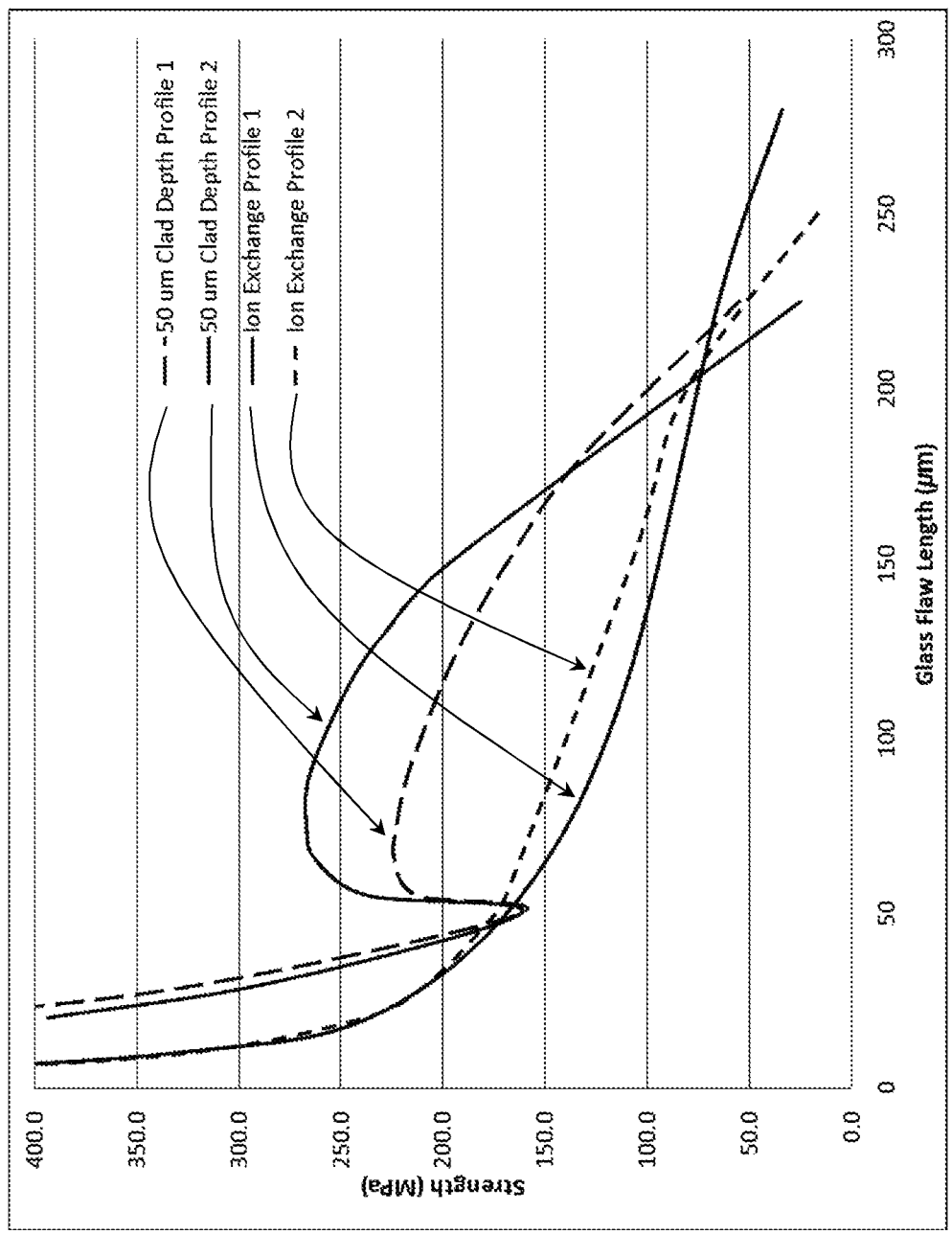
FIG. 5B illustrates a modelled strength versus flaw length plot for the stress profile in FIG. 5A.

FIG. 5B demonstrates the retained strength predictions for the two samples in FIG. 5A, and it can be seen that the stress profile shown in FIG. 5A has increased strength for flaws from 50 to 200 µm when compared to two possible approximately parabolic, deep depths of layer (DoL) profiles. Ion exchange profile 1 (solid line) and profile 2 (short dashed line) of the core glass substrates are shown as having lower strength than the profile 1 laminated article having a 50 µm cladding (long dashed line) and the profile 2 laminated article having a 50 µm cladding (solid line having the increased strength). The increased strength profiles for the laminated articles exceed twice the currently available ion exchange profile strength for some flaw depths.

Figure 6A:
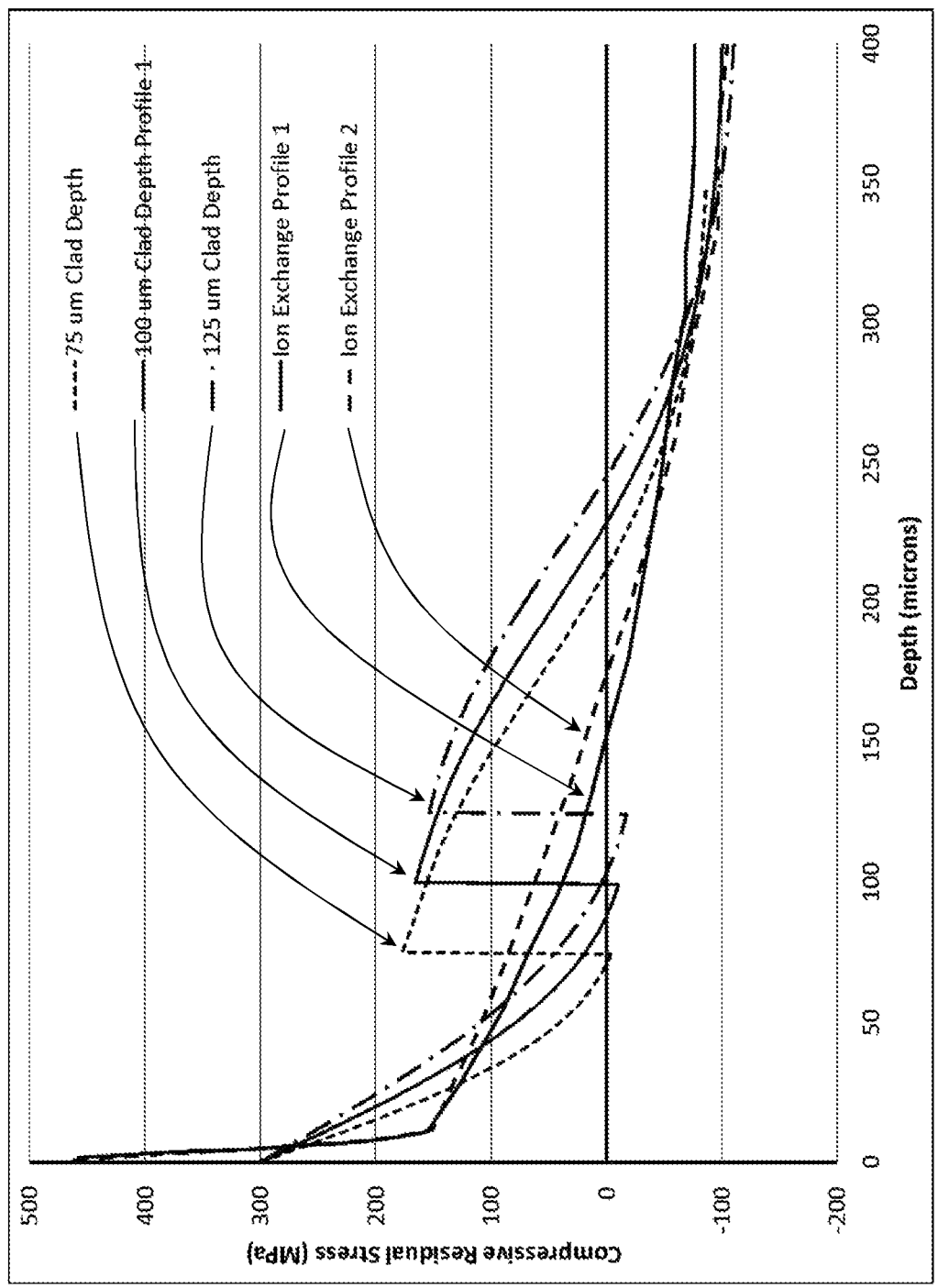
FIG. 6A illustrates a modelled stress profile of a laminated glass-based article.
Figure 6B:
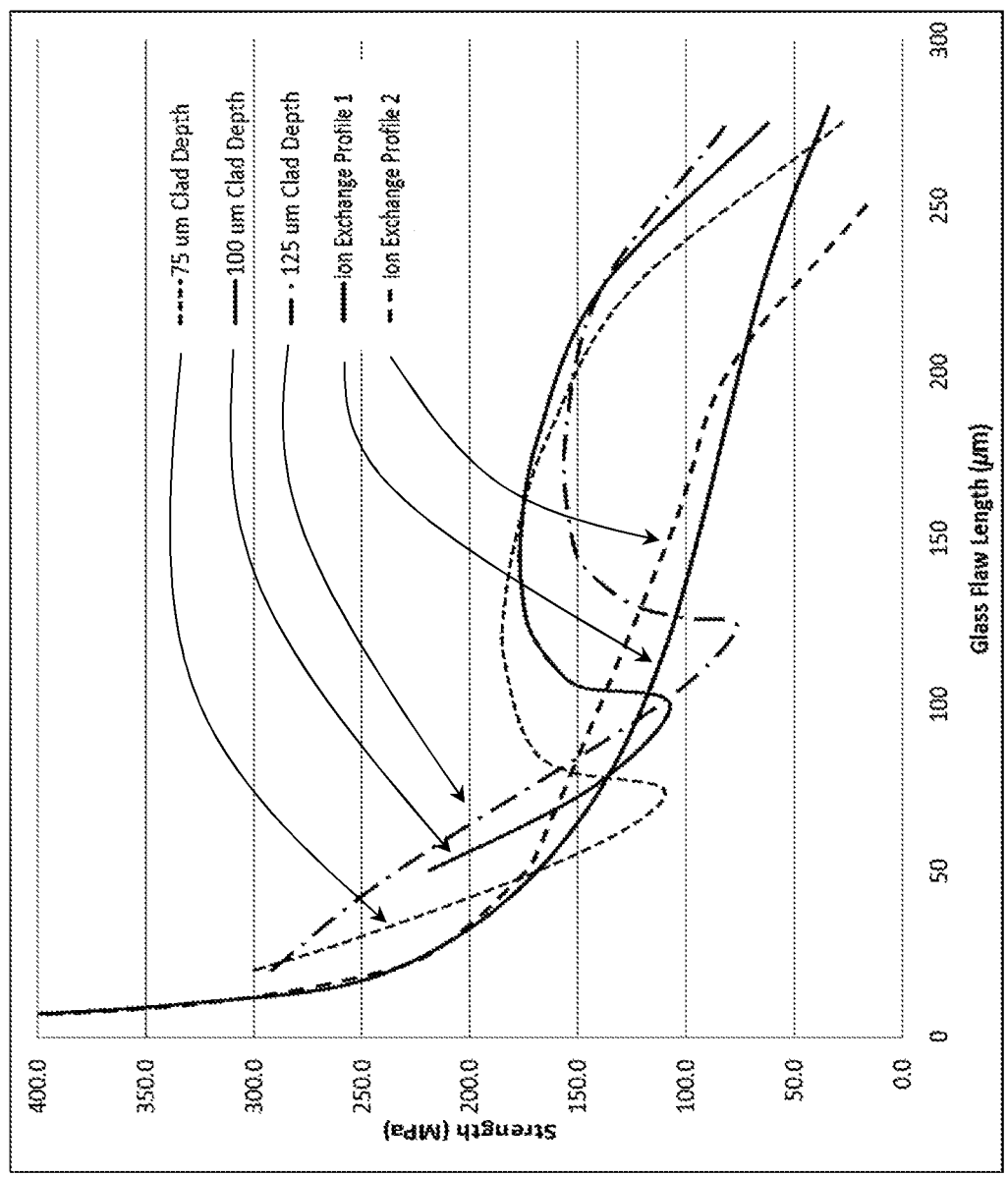
FIG. 6B illustrates a modelled strength versus flaw length plot for the stress profile in FIG. 6A.

Profiles created with 75 µm, 100 µm, and 125 µm cladding substrates are shown in FIG. 6A for two different stress profiles on a core glass substrate, and the retained strength predictions are shown in FIG. 6B. The lines labeled Ion Exchange Profile 1 and Ion Exchange Profile 2 are the core glass substrate stress profile prior to applying the cladding substrates to form a laminate stack and ion exchange of the laminate stack. It can be seen that increasing the cladding substrate thickness generally decreases the maximum strength for flaws between 100 and 200 µm, but also results in increased strength for all flaws greater than 200 µm. Thus, the laminated glass-based article stress profile can be finely tuned to provide maximized strength protection against the flaws that might be introduced during drop events on a rough surface. For all simulations, the core thickness decreased as the clad thickness increased to maintain a total thickness of 1.0 mm.

In one or more embodiments, different compositions for the core substrate and cladding substrates also allow for the stress properties of the laminated glass-based article to be tailored to optimize performance for a specific application, such as drop protection for impacts on rough surfaces. The compositions of the core substrate and cladding substrates are independent from each other, which can provide a wide range of mechanical properties, such as CTE and elastic properties. Varying the CTE of the core substrate and cladding substrates provides residual stress differences that result from cooling, which will cause either compression in the core or the clad. For example, stresses due to the CTE difference between the cladding substrates and the core substrate provides the same performance while reducing the elastic energy stored in the glass. In one or more embodiments, varying the Young's modulus of the core substrate and the cladding substrates can also be performed. FIGS. 7A-B through 9A-B provide examples.

Figure 7A:
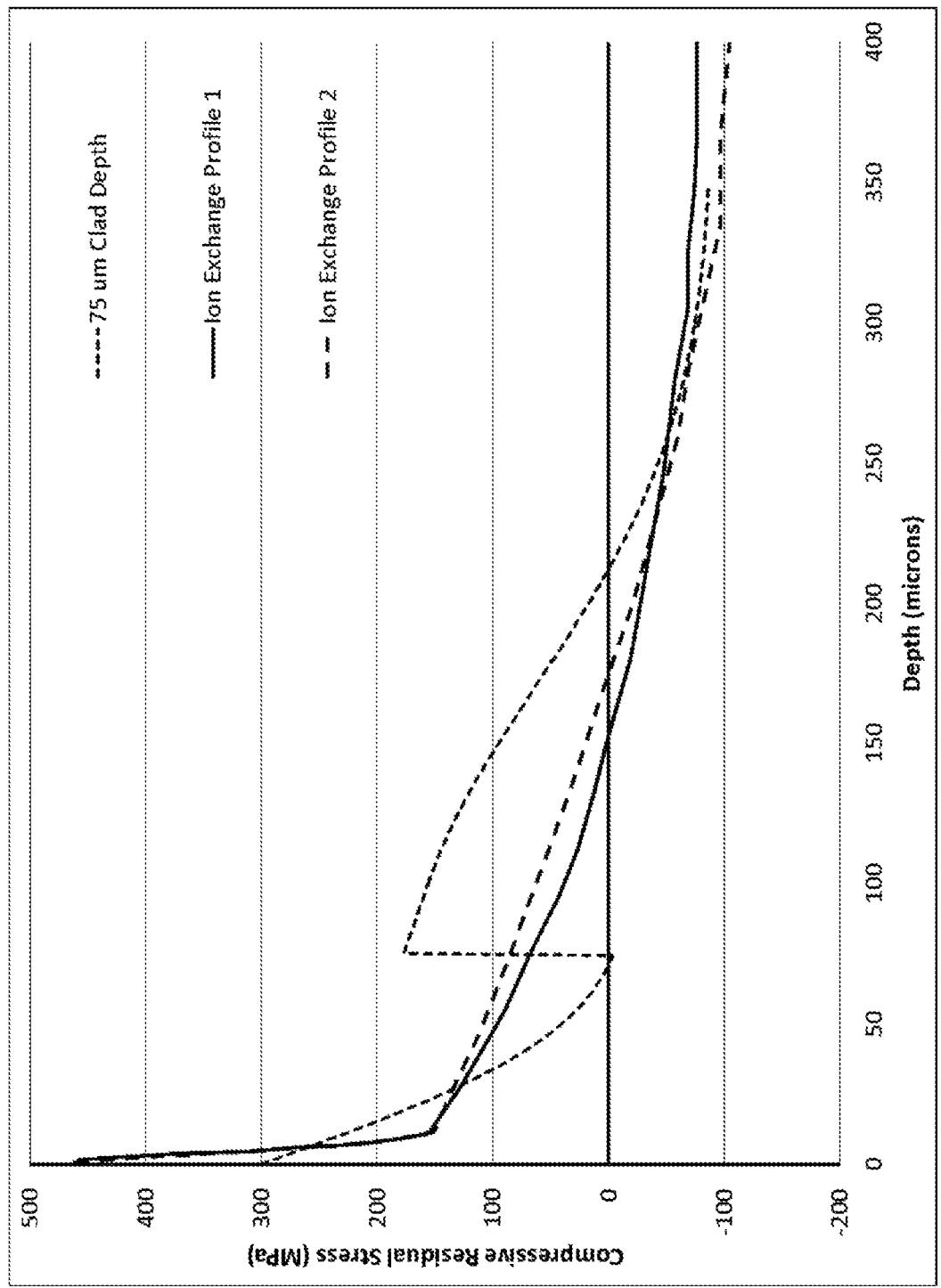
FIG. 7A illustrates a modelled stress profile of a laminated glass-based article.
Figure 7B:
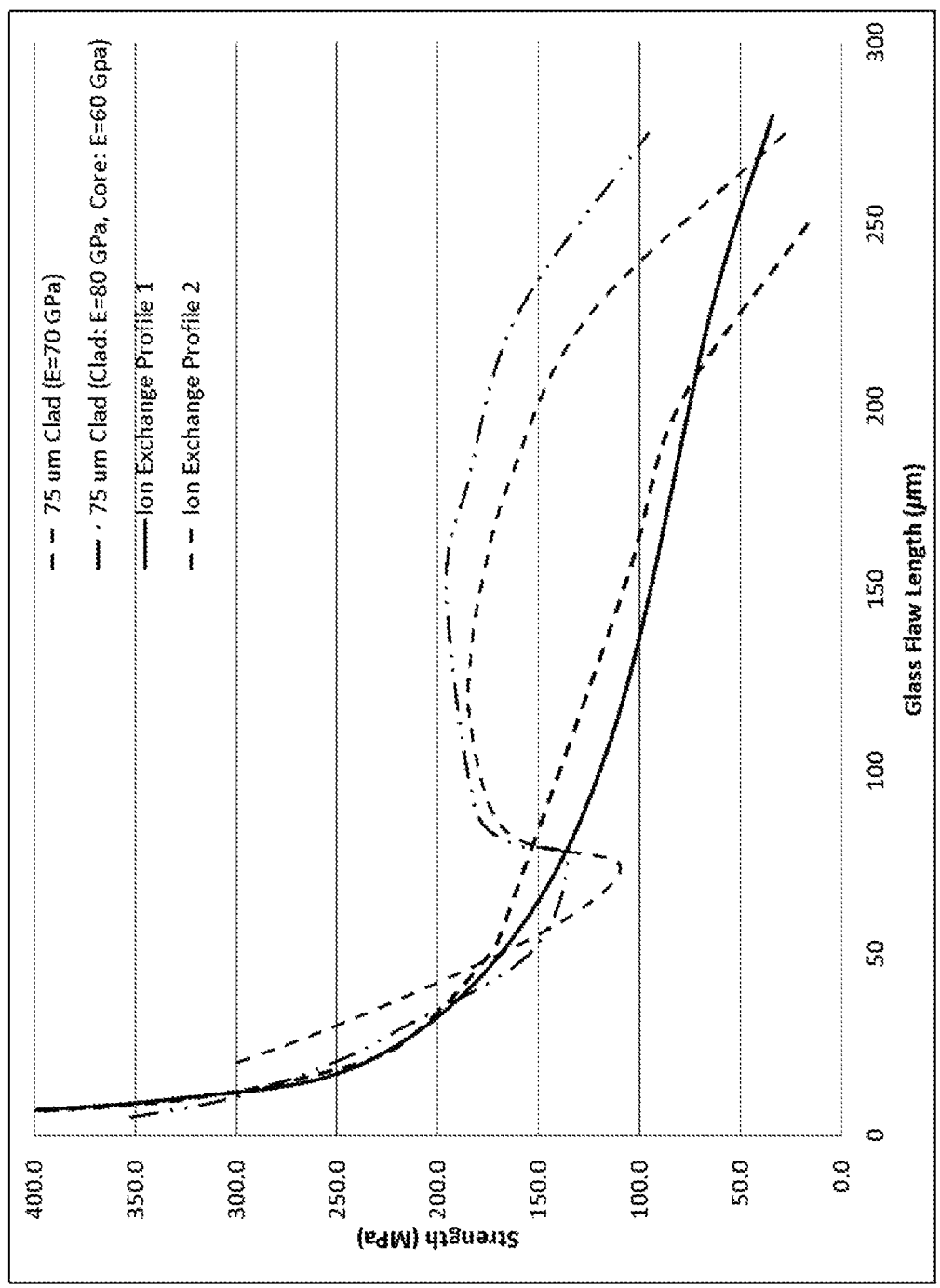
FIG. 7B illustrates a modelled strength versus flaw length plot for the stress profile in FIG. 7A.

In FIG. 7A, an exemplary profile created with two 75 µm thick cladding substrates and a total thickness of 1.0 mm compares two ion exchange profiles. Increasing the Young's modulus of the cladding substrate from 70 GPa to 80 GPa and decreasing the core Young's modulus from 70 GPa to 60 GPa results in significant increases in the strength of all flaws beyond the core/clad interface. As shown in FIG. 7B, it was found that because of the modulus mismatch the retained strength was increased for flaws that terminated in the core when compared to the case for which both the core and clad had moduli of 70 GPa. The Young's modulus value recited in this disclosure refers to a value as measured by the sonic resonance technique of the general type set forth in ASTM E1875-13, titled "Dynamic Young's Modulus, Shear Modulus, and Poisson's Ratio by Sonic Resonance."

Figure 8A:
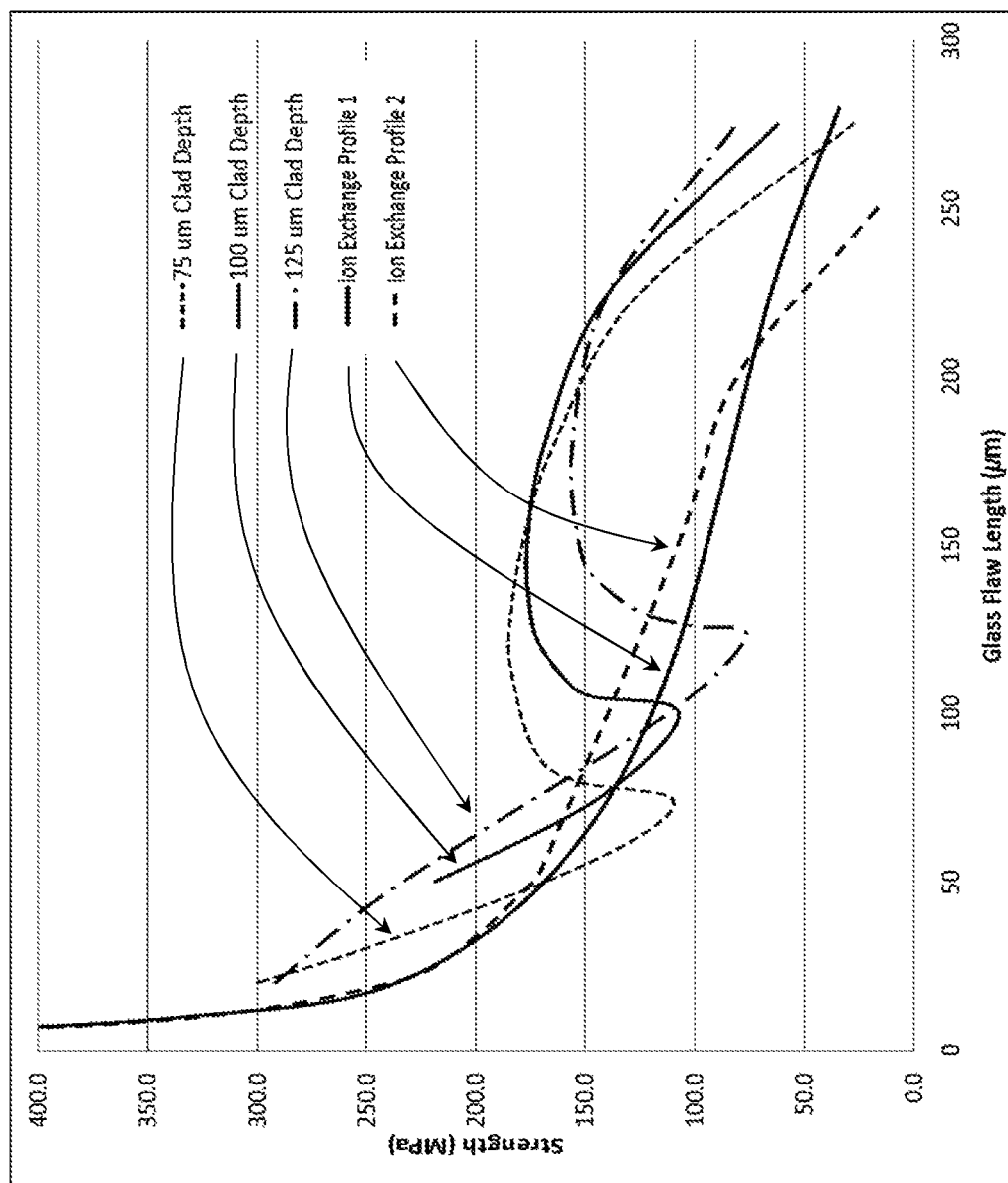
FIG. 8A illustrates a modelled stress profile of a laminated glass-based article.
Figure 8B:
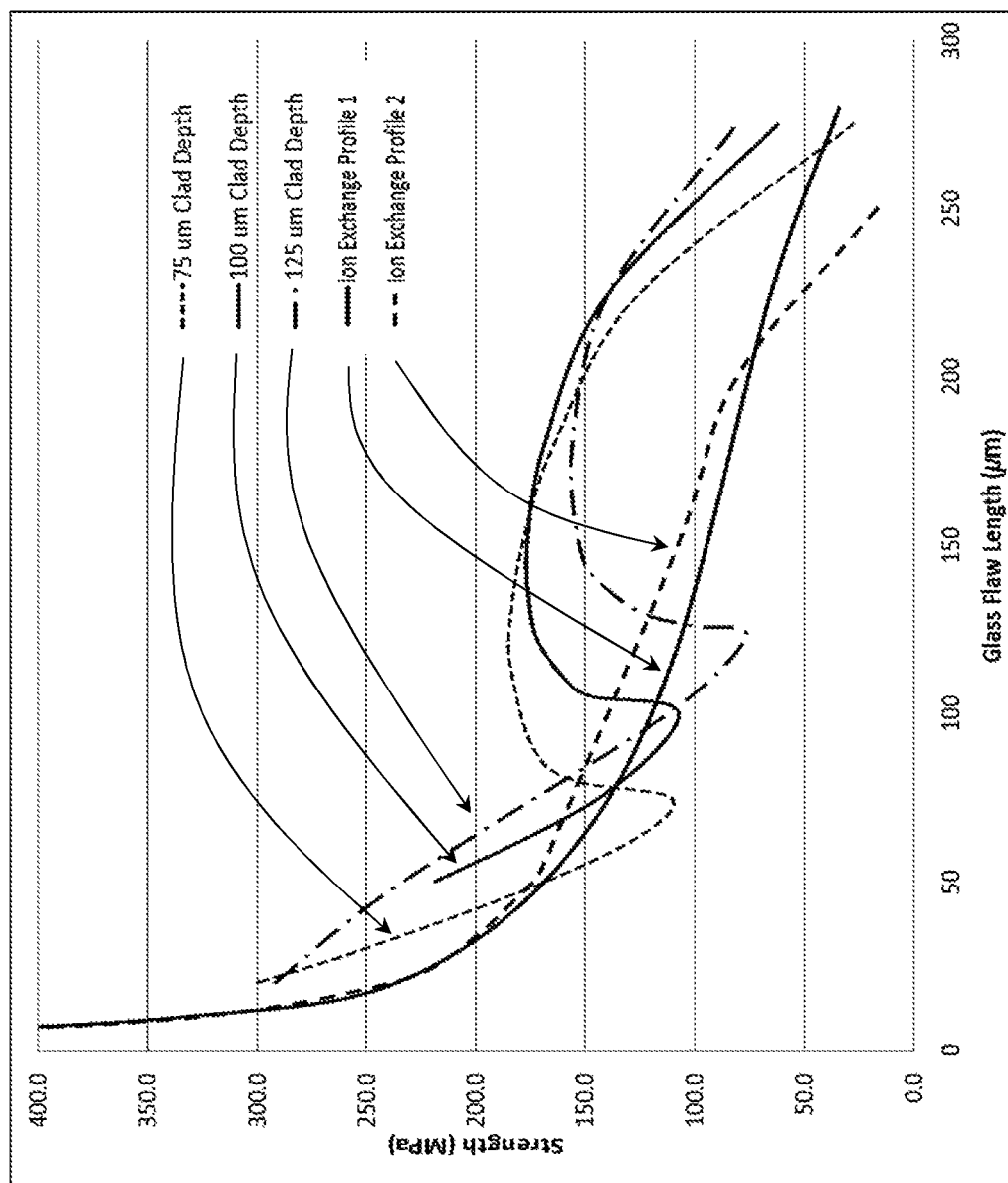
FIG. 8B illustrates a modelled strength versus flaw length plot for the stress profile in FIG. 8A.

FIG. 8A shows exemplary profile created with two 100 µm thick cladding substrates and a total thickness of 1.0 mm, comparing two possible ion exchange profiles. As shown in FIG. 8B, retained strength plots that demonstrate the effects of varying the core substrate and cladding substrate Young's moduli. In this exemplary case, the core substrate modulus was 60 GPa, while the cladding substrate modulus was 80 GPa. It was found that because of the modulus mismatch the retained strength was increased for flaws that terminated in the core when compared to the case for which both the core substrate and cladding substrate had Young's moduli of 70 GPa.

Figure 9A:
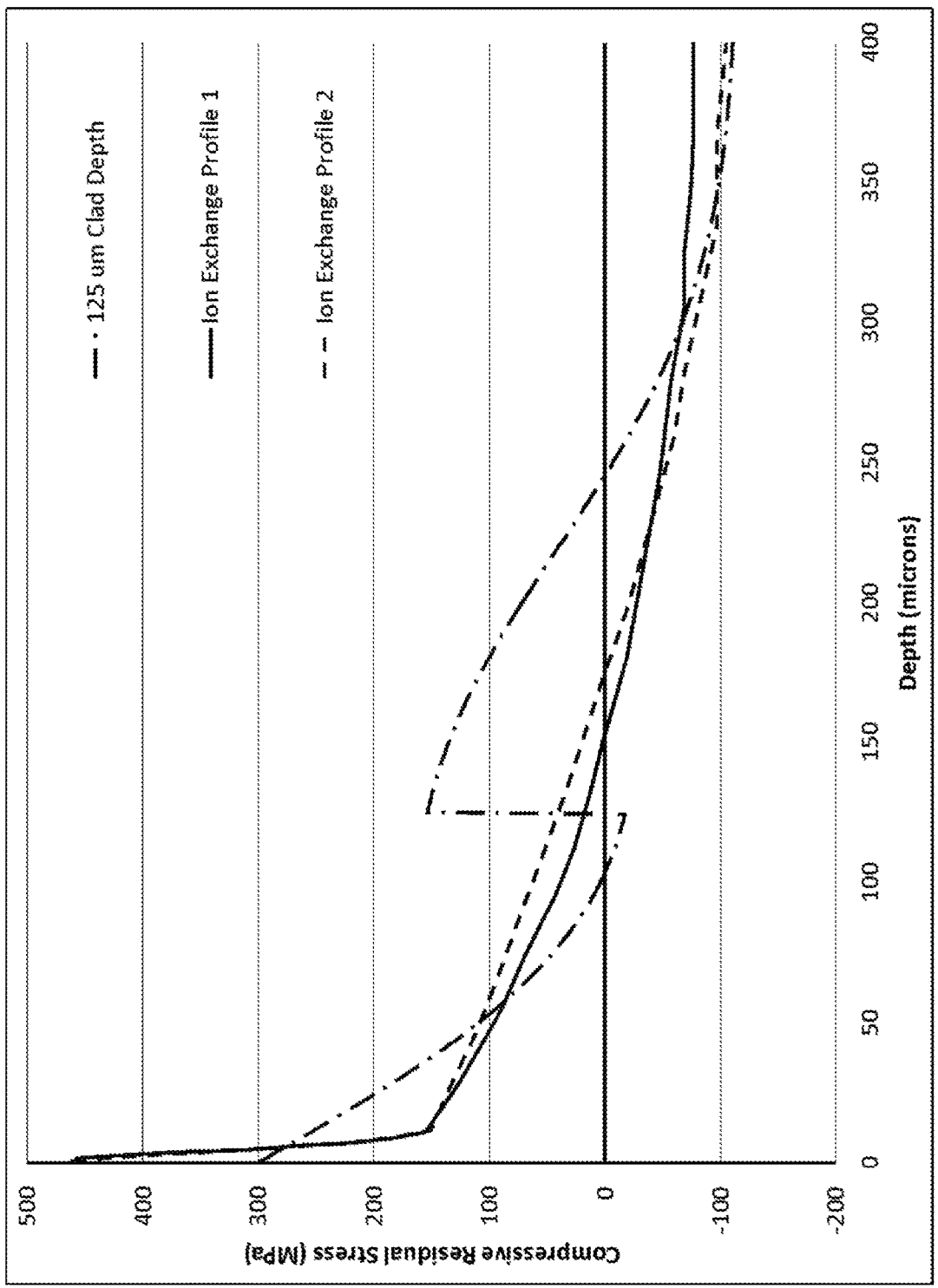
FIG. 9A illustrates a modelled stress profile of a laminated glass-based article.
Figure 9B:
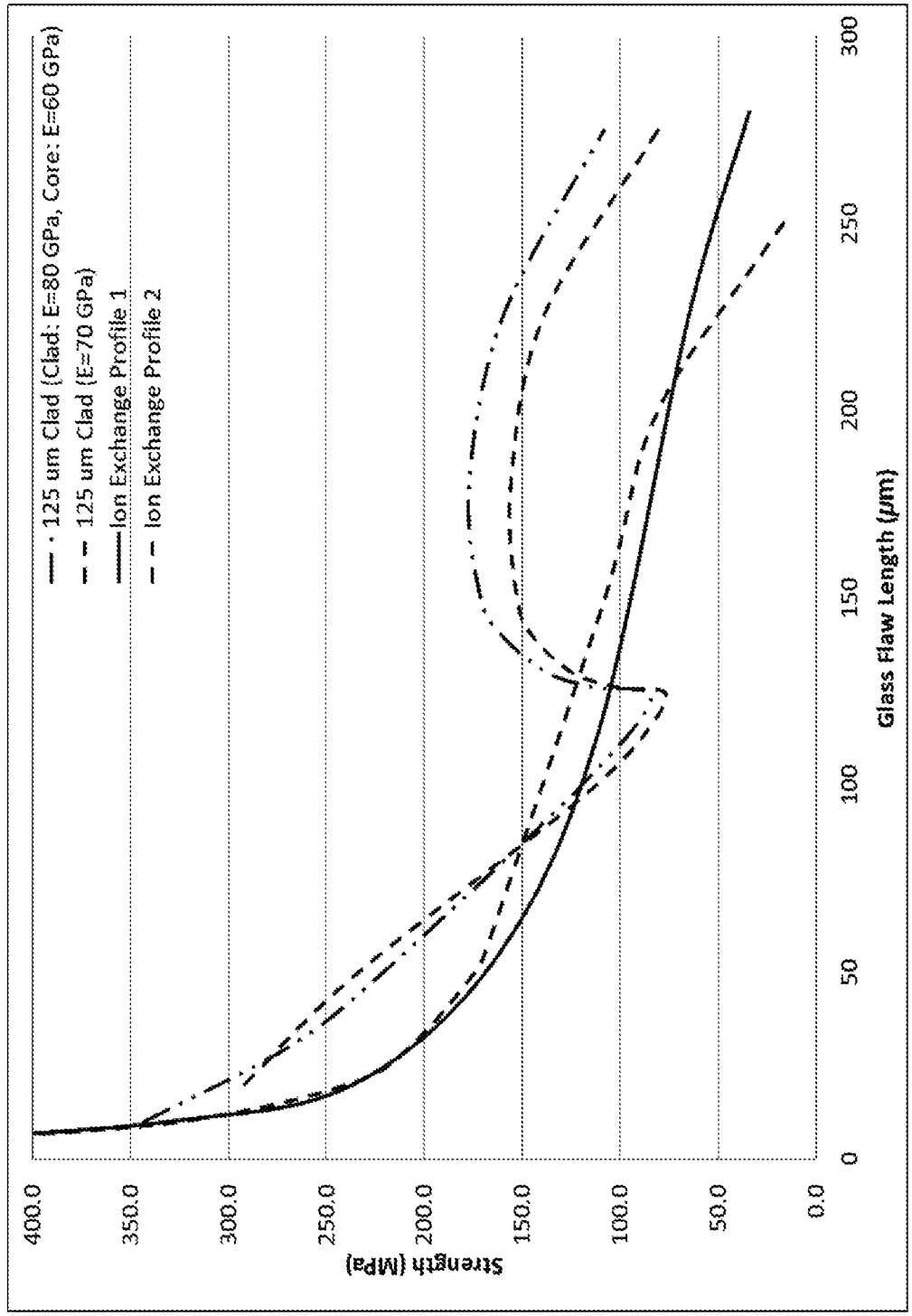
FIG. 9B illustrates a modelled strength versus flaw length plot for the stress profile in FIG. 9A.

In FIG. 9A, an exemplary profile created with two 125 µm thick cladding substrates and a total thickness of 1.0 mm compares two possible ion exchange profiles. As shown in FIG. 9B, the core substrate Young's modulus was 60 GPa, while the cladding substrate Young's modulus was 80 GPa. Because of the modulus mismatch the retained strength was increased for flaws that terminated in the core when compared to the case for which both the core and clad had moduli of 70 GPa. FIGS. 8-10 demonstrate that according to embodiments of the disclosure, an additional mechanism for increasing the damage resistance of a laminate glass article due to deep damage is provided, in addition to a way to tune and optimize stress profiles for the finished laminated glass articles.

The mobility of ions at the interfaces between the core substrate and cladding substrates is not accounted for in FIGS. 8-10. It is possible that ions in the core could possibly diffuse into the cladding, and vice versa. Several of the profiles in FIGS. 8-10 have a small amount of tension at the boundary of the cladding that can result in subcritical crack growth for at least some crack lengths. In addition, the tension resulted in a pronounced dip in the retained strength. Longer and deeper ion exchange of the cladding substrates will address each of these issues, as the longer and deeper ion exchanges will remove the tension.

Figure 10A:
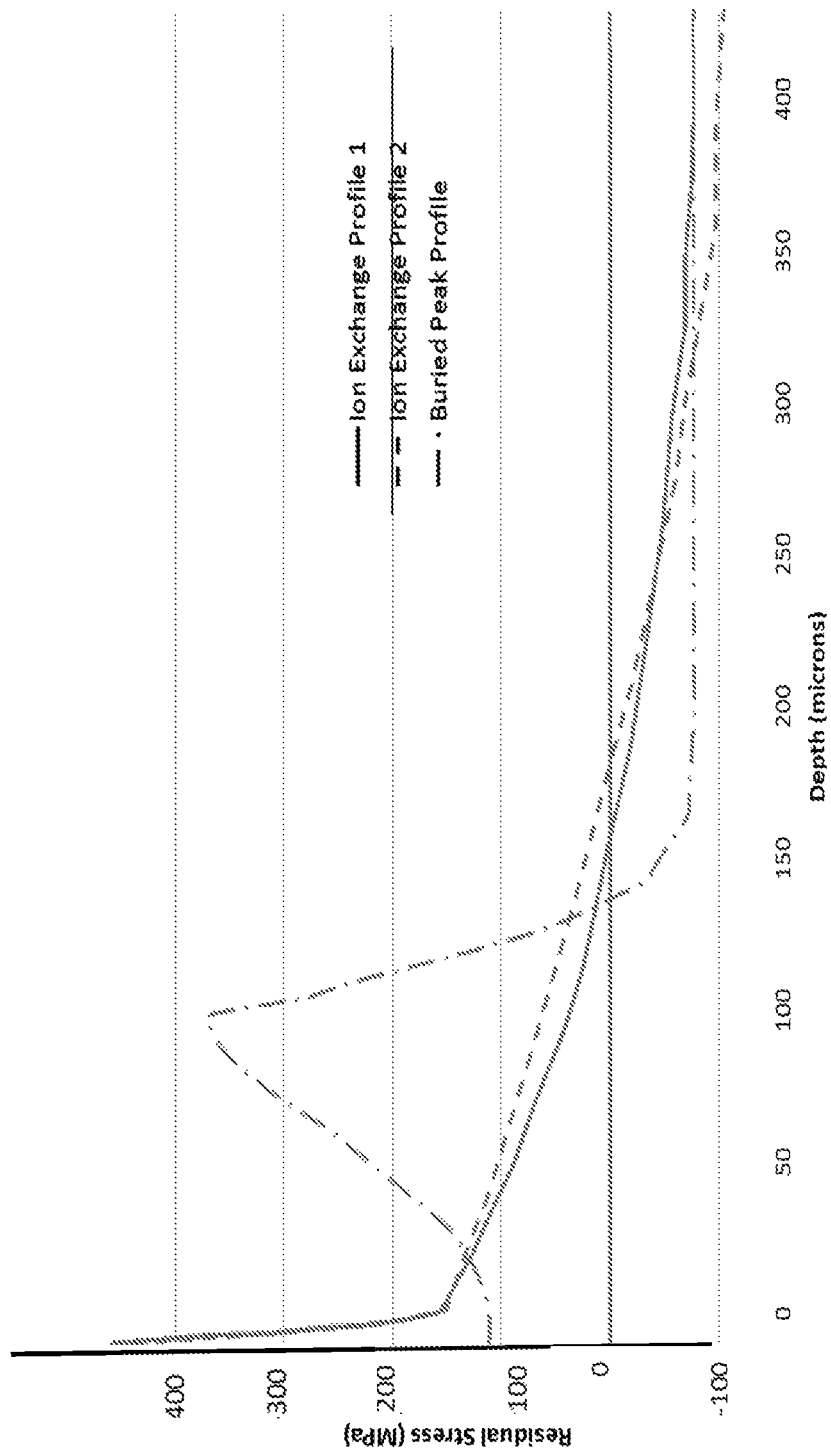
FIG. 10A illustrates a modelled stress profile of a laminated glass-based article.
Figure 10B:
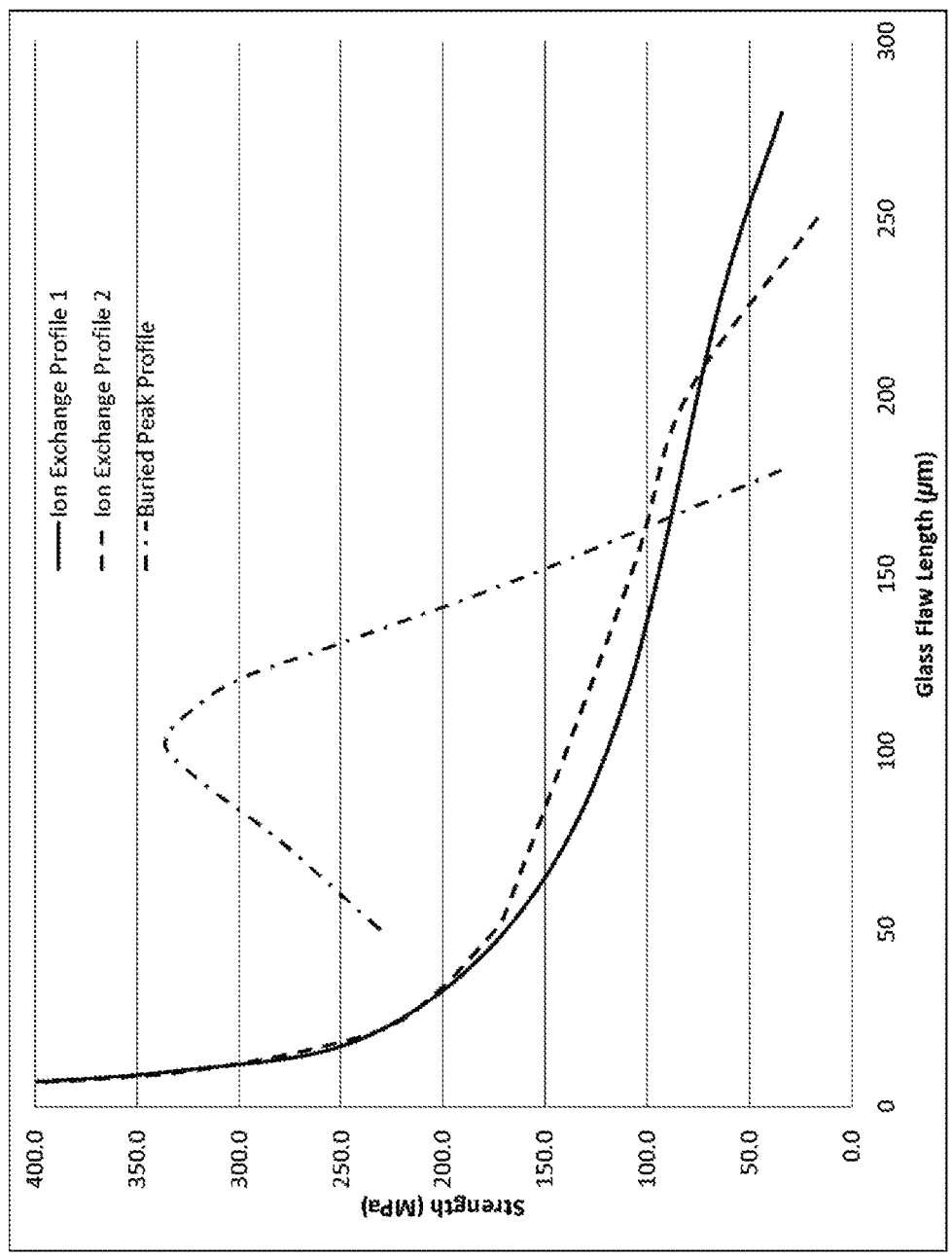
FIG. 10B illustrates a modelled strength versus flaw length plot for the stress profile in FIG. 10A.

In addition, by careful selection of core and clad composition as well as ion-exchange parameters, a profile like the one shown in FIG. 10A provides an example of a buried peak profile, for laminated glass-based article which has total thickness of 1.0 mm and two cladding substrates each having a thickness of 100 µm. The buried peak can be very deep, for example, greater than 25 µm, 30 µm, 35 µm, 40 µm, 45 µm, 50 µm, 60 µm, 70 µm, 80 µm, 90 µm, 100 µm, 125 µm, or 150 µm, unlike the buried peak profile created through dual ion exchanges of a single substrate. The retained strength plot is shown in FIG. 10B, and demonstrates similar results to the examples shown above. However, this plot also demonstrates a rising-R-curve behavior in which crack growth is associated with increasing strength for cracks smaller than 100 microns, which results in stable crack growth as well as a tighter reliability distribution of strength. Thus the lamination process provides a platform for creating such engineered stress profiles with unique characteristics. The buried peak profile has a strength advantage over the comparison profiles up to 175 µm, and the depth and magnitude of the difference can be adjusted to suit the application through the parameters of ion exchanges and clad thickness.

Figure 11:
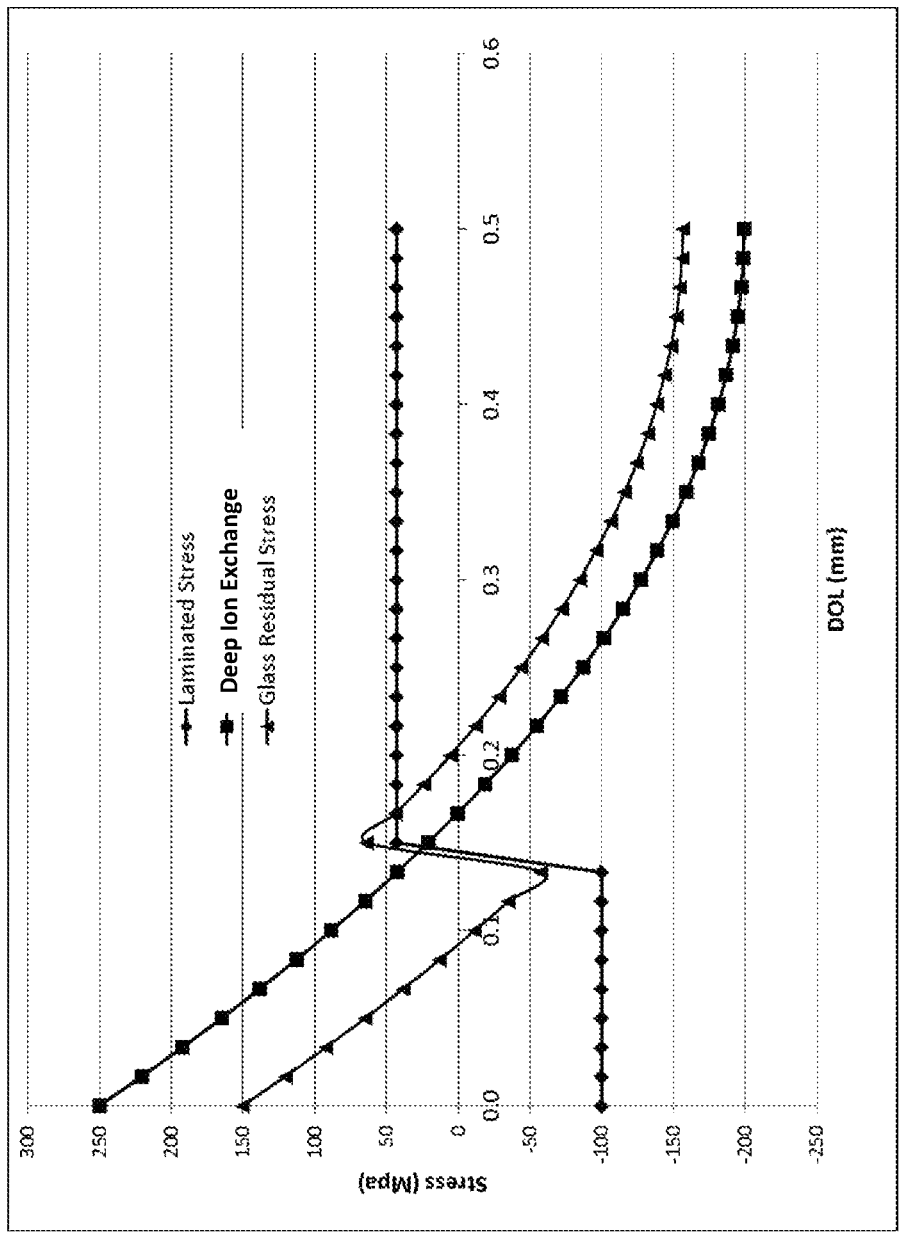
FIG. 11 illustrates a modelled stress profile of a laminated glass-based article.

In addition, the process described herein to form laminated glass-based articles can be used to integrate sensors, or other features, into laminated glass-based articles, which is useful in the manufacture of cover glasses for electronic devices such as mobile phones and tablets. Sensors may benefit by being closer to the surface of the glass, but thinner cover glass can compromise the strength. Integrating the sensor into the cover glass can therefore serve the purpose of locating the sensor close to the glass surface without compromising the strength of the cover. In order to do so, the touch sensor is deposited on a glass substrate. Once the sensor is deposited onto the substrate, silica is deposited onto the surface of the sensor. Alternately, if the sensor material has sufficient silicon-oxygen bonds to create strong covalent bonds with the clad at bonding temperatures of 400° C. then the silica deposition step on the sensor will not be required. All of the components are then bonded together through the heating process of the laminate stack to form covalent bonds, as described herein, but with the sensor and clad being bonded to one side and only the clad bonded to the other. Such a process is beneficial when the sensor can survive temperatures of approximately 400° C. In addition to a sensor any other functional layers such as optical light guides and photochromatic layers can be protected in this way According to one or more embodiments, an alternative method (referred to as the CTE difference method) to make laminated glass-based articles includes a lamination process followed by a deep ion exchange process. In an embodiment, a laminated glass-based article is made using a laminated fusion process, as described in United States Patent Application Publication No. 20160114564A1. In such a process, a laminate fusion draw apparatus for forming a laminated glass article includes an upper isopipe which is positioned over a lower isopipe. The upper isopipe includes a trough into which a molten glass cladding composition is fed from a melter. Similarly, the lower isopipe includes a trough into which a molten glass core composition is fed from a melter. In the embodiments, described herein, the molten glass core composition has an average core coefficient of thermal expansion $CTE_{core}$ which is lower than the average cladding coefficient of thermal expansion $CTE_{clad}$ of the molten glass cladding composition For this laminated glass-based article, the CTE of the cladding is higher than that of the core, so that the clad is under tension after cooling down to room temperature. Then, the laminated glass-based article is ion exchanged. An example of profile created by such a process is illustrated in FIG. 11, which shows stress profiles of laminated glass and deep ion exchange. A laminated glass is prepared with stress profile of the diamond curve. The cladding is in tension and the core is in compression, which is opposite the conventional laminated glass. This lamination process is followed by a deep ion exchange process. The residual stress from this ion exchange process is the square curve. The final residual stress is the sum of the two stresses from lamination and ion exchange. For the lamination, the CTE of the cladding is higher than that of the core, so that the cladding is under tension after cooling down to room temperature.

In FIG. 11, the residual stress of the final product was assumed to be the sum of the lamination and ion exchange stresses. In this embodiment, the clad thickness is 0.12 mm, and the thickness of the laminated glass is 1.0 mm. The depth of the compressive layer is increased from around 166 µm to over 200 µm. This is more than 30 µm increase and can improve retained strength of the material for deep flaws.

According to one or more embodiments, laminated glass-based articles as described herein can be used as thin cover glasses for mobile electronic devices such as mobile phones and tables. The stress profiles of a laminated glass-based article having a total thickness of 0.4 mm, with the cladding substrates being 65 µm to 80 µm in thickness, are plotted in FIG. 12. The solid curve is the residual stress from ion exchange (non-lamination), and the dashed curve is the final residual stress due to the linear summation of the lamination and ion exchange stresses. The depth of the compressive layer is increased roughly from 65 µm to 80 µm.

Figure 12:
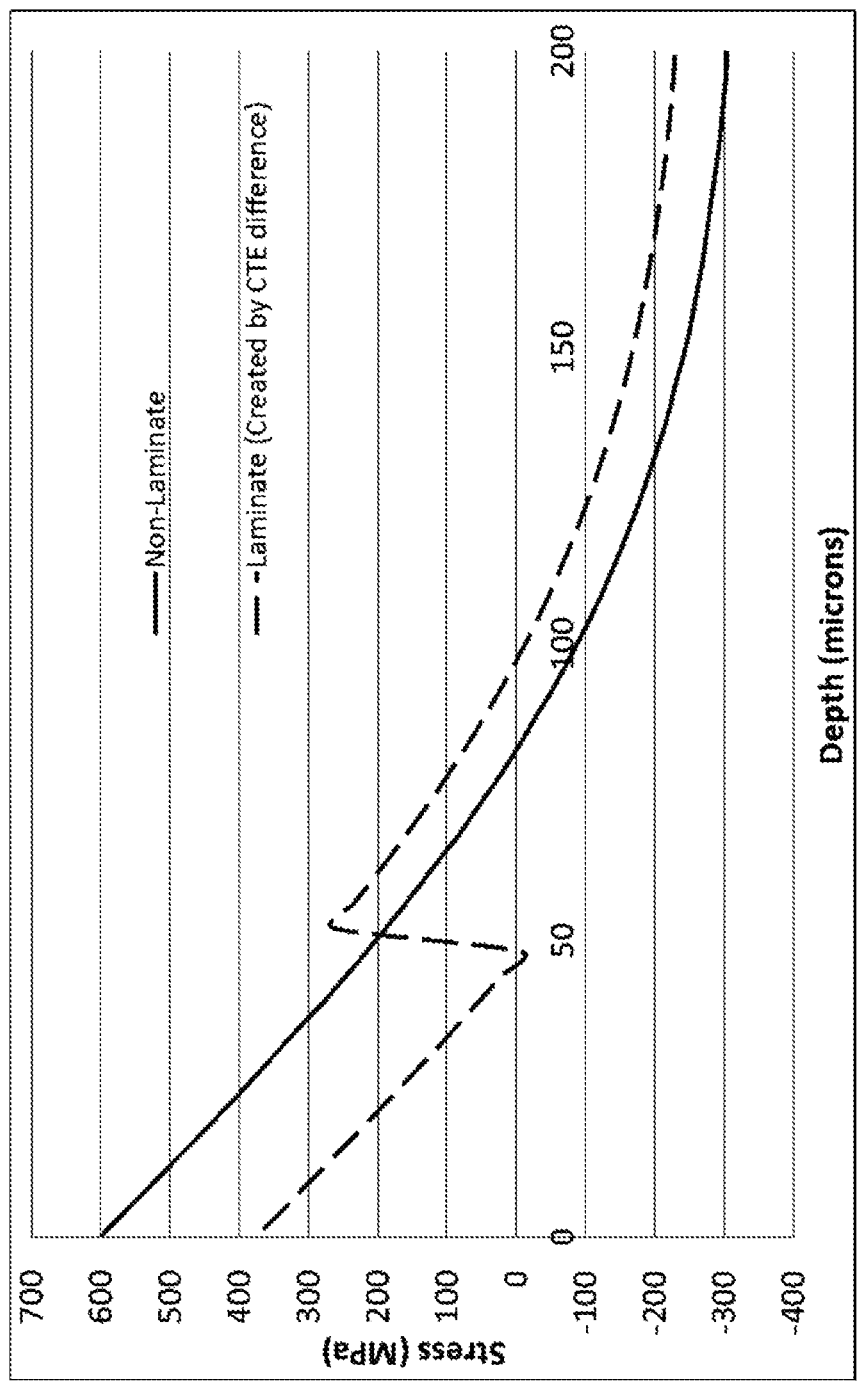
FIG. 12 illustrates a modelled s profile of a laminated glass-based article.
Figure 13:
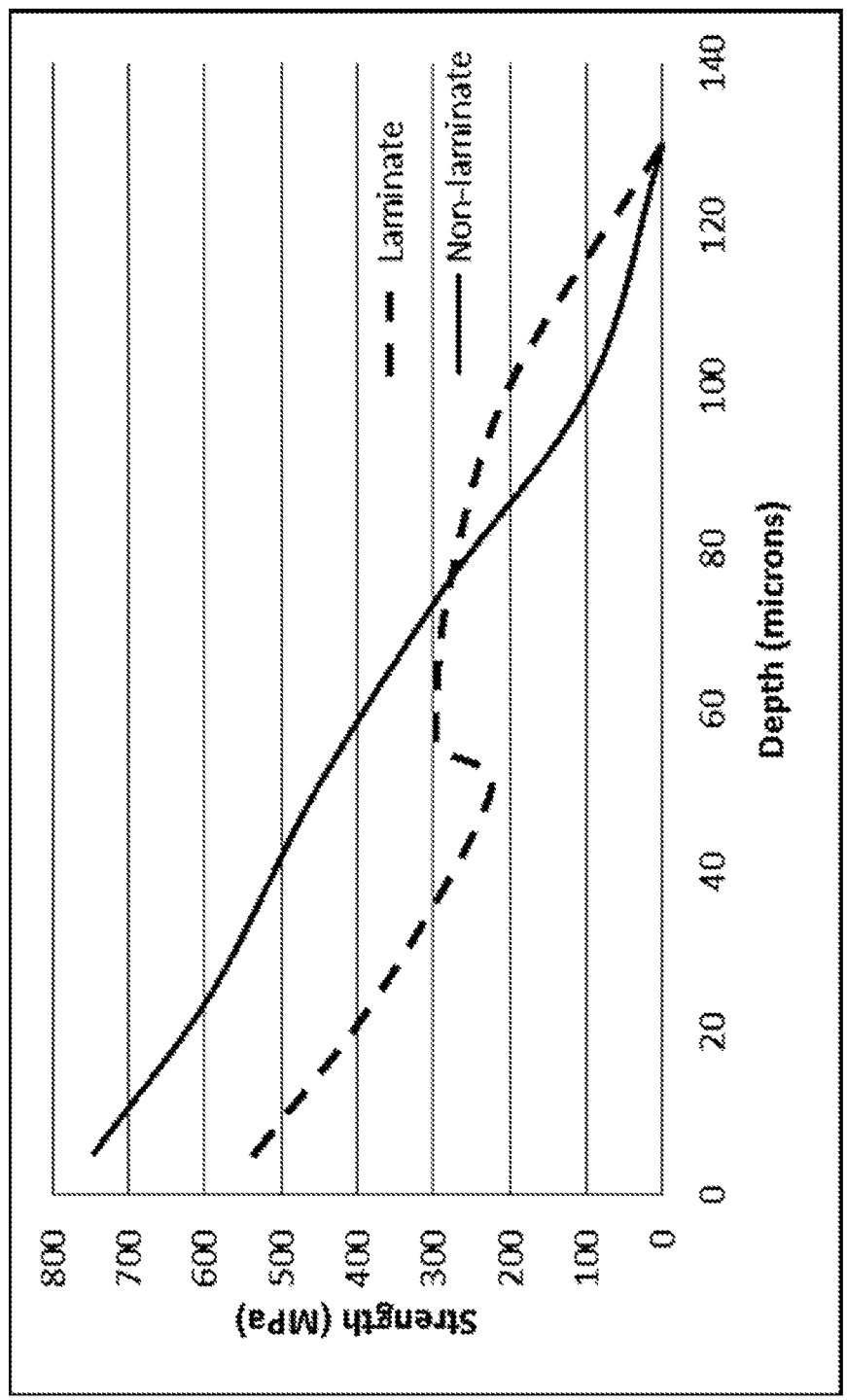
FIG. 13 illustrates a modelled strength versus depth profile of the laminated glass-based article profile in FIG. 12.

The retained strength of the stress profile of FIG. 12 is plotted in FIG. 13, which shows the non-monotonic retained strength with flaw size for the laminated sample. This is compared with the retained strength of the non-laminated glass shown by the solid line. In this case, the retained strength is larger when the flaw size is deeper than 80 µm. It is beneficial when a deep flaw, for example 100 µm, is introduced to the laminated cover glass in an undesired event, for example dropping onto a hard surface. It would take twice of a flexural stress, 200 MPa vs. 100 MPa, to break this glass. The central tension in the laminate case has decreased, meaning that some combination of compressive stress magnitude and depth of layer can be increased before the central tension matches the non-laminate case, which will improve the deep damage performance. Once this is done, the performance advantage of the laminate profile will further increase relative to the non-laminate profile.

Figure 14:
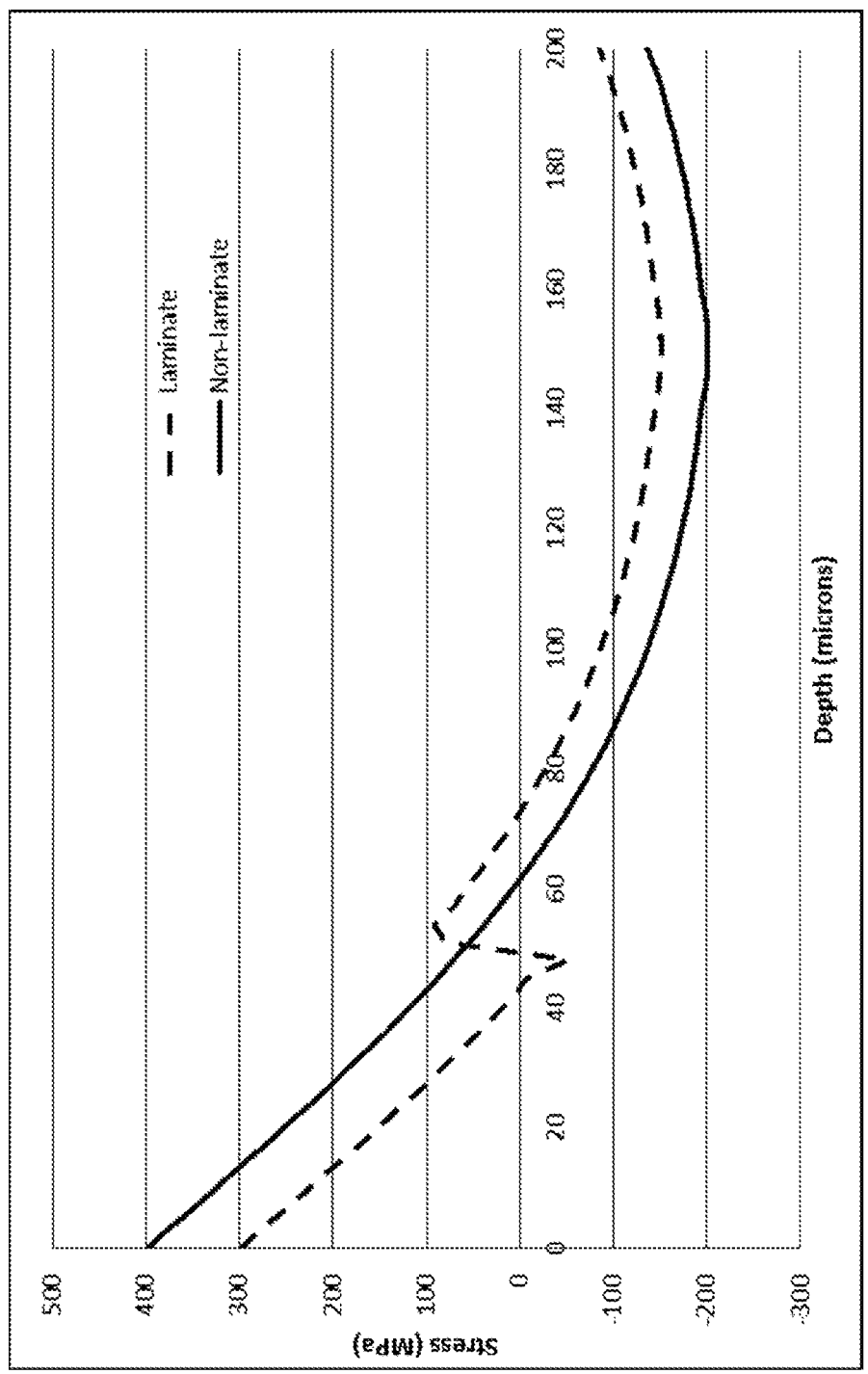
FIG. 14 illustrates a modelled stress profile of a laminated glass-based article.
Figure 15:
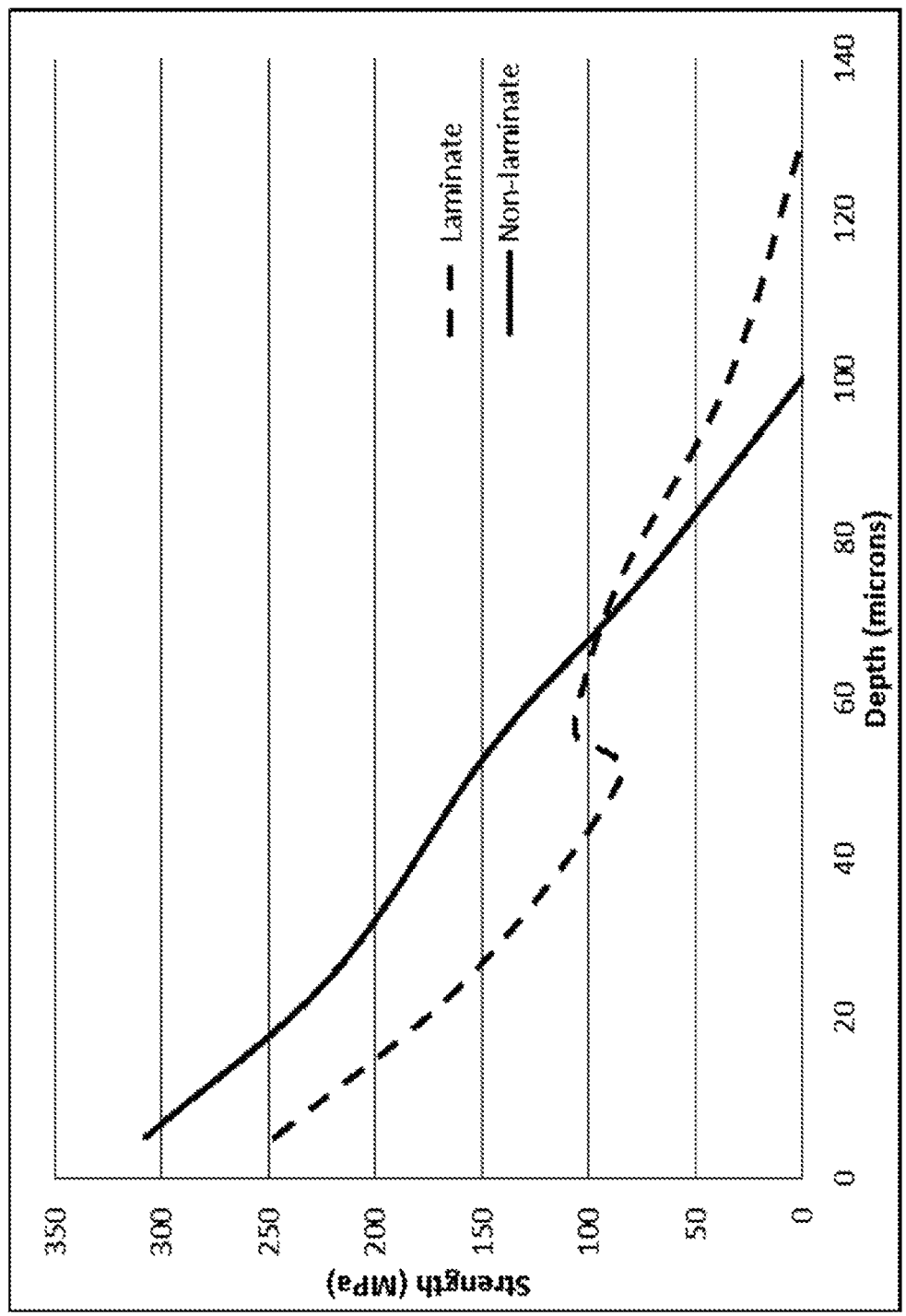
FIG. 15 illustrates a modelled strength versus depth profile of the laminated glass-based article profile in FIG. 14.

Another embodiment is illustrated in FIG. 14 and FIG. 15 for a thinner glass-based article having an overall thickness of 0.3 mm, with the cladding substrates being 50 µm thick. The benefits in depth of compressive layer and retained strength at deep flaws are similar to the 0.4 mm glass that has been discussed above. The depth of the compressive layer is increased roughly from 60 µm to 75 µm. There is a roughly 20% increase in depth of compressive layer, and better retained strength at deep flaws above 70 µm. For a constant clad thickness and tension, the benefits of the proposed alternative method decrease as the core thickness increases because the energy balance dictates that the central compression is inversely proportional to the core thickness.

According to one or more embodiments, the increase or decrease in strength on one side of a glass-based substrate can be determined using abraded ring on ring testing. The strength of a material is defined as the stress at which fracture occurs. The abraded ring on ring test is a surface strength measurement for testing flat glass specimens, and ASTM C1499-09(2013), entitled "Standard Test Method for Monotonic Equibiaxial Flexural Strength of Advanced Ceramics at Ambient Temperature," serves as the basis for the abraded ring on ring test methodology described herein. The contents of ASTM C1499-09 are incorporated herein by reference in their entirety. In one embodiment, the glass specimen is abraded prior to ring-on-ring testing with 90 grit silicon carbide (SiC) particles that are delivered to the glass sample using the method and apparatus described in Annex A2, entitled "abrasion Procedures," of ASTM C158-02 (2012), entitled "Standard Test Methods for Strength of Glass by Flexure (Determination of Modulus of Rupture). The contents of ASTM C158-02 and the contents of Annex 2 in particular are incorporated herein by reference in their entirety.

Prior to ring-on-ring testing a surface of the glass-based article is abraded as described in ASTM C158-02, Annex 2, to normalize and/or control the surface defect condition of the sample using the apparatus shown in Figure A2.1 of ASTM C158-02. The abrasive material is typically sand-blasted onto the surface 110 of the glass-based article at a load of 15 psi using an air pressure of 304 kPa (44 psi). After air flow is established, 5 cm$^3$ of abrasive material is dumped into a funnel and the sample is sandblasted for 5 seconds after introduction of the abrasive material.

Figure 16:
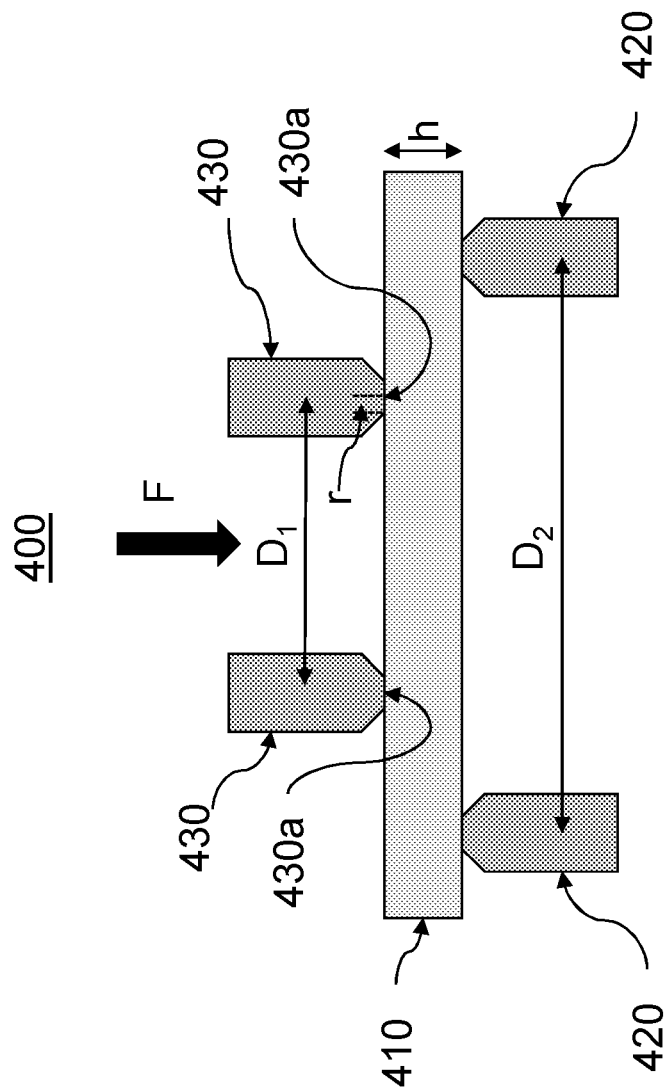
FIG. 16 illustrates a ring on ring testing setup for measuring strength of a substrate.

For the abraded ring on ring test, a glass-based article having at least one abraded surface 410 as shown in FIG. 16 is placed between two concentric rings of differing size to determine equibiaxial flexural strength (i.e., the maximum stress that a material is capable of sustaining when subjected to flexure between two concentric rings), as also shown in FIG. 16. In the abraded ring on ring configuration 400, the abraded glass-based article 410 is supported by a support ring 420 having a diameter D2. A force F is applied by a load cell (not shown) to the surface of the glass-based article by a loading ring 430 having a diameter D1.

The ratio of diameters of the loading ring and support ring D1/D2 may be in a range from about 0.2 to about 0.5. In some embodiments, D1/D2 is about 0.5. Loading and support rings 130, 120 should be aligned concentrically to within 0.5% of support ring diameter D2. The load cell used for testing should be accurate to within ±1% at any load within a selected range. In some embodiments, testing is carried out at a temperature of 23±2° C. and a relative humidity of 40±10%.

For fixture design, the radius r of the protruding surface of the loading ring 430, b/2≤r≤3 h/2, where h is the thickness of glass-based article 410. Loading and support rings 430, 420 are typically made of hardened steel with hardness HRc>40. Abraded ring on ring fixtures are commercially available.

The intended failure mechanism for the abraded ring on ring test is to observe fracture of the glass-based article 410 originating from the surface 430*a* within the loading ring 430. Failures that occur outside of this region—i.e., between the loading rings 430 and support rings 420—are omitted from data analysis. Due to the thinness and high strength of the glass-based article 410, however, large deflections that exceed ½ of the specimen thickness h are sometimes observed. It is therefore not uncommon to observe a high percentage of failures originating from underneath the loading ring 430. Stress cannot be accurately calculated without knowledge of stress development both inside and under the ring (collected via strain gauge analysis) and the origin of failure in each specimen. Abraded ring on ring testing therefore focuses on peak load at failure as the measured response.

The strength of glass-based article depends on the presence of surface flaws. However, the likelihood of a flaw of a given size being present cannot be precisely predicted, as the strength of glass is statistical in nature. A probability distribution can therefore generally be used as a statistical representation of the data obtained.

Glass-based articles described according to one or more embodiments can have a variety of end uses. In one or more embodiments, such glass-based articles include architectural glazings, automotive windshields and glazings. According to one or more embodiments, opposing surfaces of glass-based articles can be designed and tailored to have the desired strength and reliability. Similar considerations apply to architectural glazings used in building construction.

According to one or more embodiments, flaw sizes can be determined using fractography as follows. Flaw size can be determined using fractography by using ASTM Standard: C1322-15 (Standard Practice for Fractography and Characterization of Fracture Origins in Advanced Ceramics) to determine flaw sizes (origin sizes) for samples broken using four-point bend test (ASTM C1161: Standard Test Method for Flexural Strength of Advanced Ceramics at Ambient Temperature) or ring-on-ring test (ASTM C1499-15). This establishes the flaw size distribution for the glass sheet in the intended application. The more samples that are used for the destructive testing, the better the confidence in the flaw size distribution data from testing. Alternatively, according to one or more embodiments, flaw size can be determined using strength testing and fracture mechanics analysis. In an embodiment, strength data is obtained using as many samples as is feasible using a suitable strength test (four point bend for edge strength and ring-on-ring for interior strength). Using a suitable fracture analysis model (analytical or Finite element analysis), one can estimate the flaw size that must have caused failure of the sample in the strength test. This assumes a particular flaw size, shape, and location and hence the approach is not as accurate as the fractography approach but it is easier to establish flaw populations.

The strengthened glass-based substrates may be provided using a variety of different processes. For example, exemplary glass-based substrate forming methods include float glass processes and down-draw processes such as fusion draw and slot draw. A glass-based substrate prepared by a float glass process may be characterized by smooth surfaces and uniform thickness is made by floating molten glass on a bed of molten metal, typically tin. In an example process, molten glass that is fed onto the surface of the molten tin bed forms a floating glass ribbon. As the glass ribbon flows along the tin bath, the temperature is gradually decreased until the glass ribbon solidifies into a solid glass-based substrate that can be lifted from the tin onto rollers. Once off the bath, the glass-based substrate can be cooled further and annealed to reduce internal stress.

Down-draw processes produce glass-based substrates having a uniform thickness that possess relatively pristine surfaces. Because the average flexural strength of the glass-based substrate is controlled by the amount and size of surface flaws, a pristine surface that has had minimal contact has a higher initial strength. When this high strength glass-based substrate is then further strengthened (e.g., chemically), the resultant strength can be higher than that of a glass-based substrate with a surface that has been lapped and polished. Down-drawn glass-based substrates may be drawn to a thickness of less than about 2 mm. In addition, down drawn glass-based substrates have a very flat, smooth surface that can be used in its final application without costly grinding and polishing.

The fusion draw process, for example, uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films. These outside surfaces of the drawing tank extend down and inwardly so that they join at an edge below the drawing tank. The two flowing glass films join at this edge to fuse and form a single flowing glass-based substrate. The fusion draw method offers the advantage that, because the two glass films flowing over the channel fuse together, neither of the outside surfaces of the resulting glass-based substrate comes in contact with any part of the apparatus. Thus, the surface properties of the fusion drawn glass-based substrate are not affected by such contact.

The slot draw process is distinct from the fusion draw method. In slow draw processes, the molten raw material glass is provided to a drawing tank. The bottom of the drawing tank has an open slot with a nozzle that extends the length of the slot. The molten glass flows through the slot/nozzle and is drawn downward as a continuous substrate and into an annealing region.

In some embodiments, the compositions used for the glass-based substrate may be batched with 0-2 mol % of at least one fining agent selected from a group that includes $Na_2SO_4$, NaCl, NaF, NaBr, $K_2SO_4$, KCl, KF, KBr, and $SnO_2$.

Once formed, a glass-based substrate may be strengthened to form a strengthened glass-based substrate to provide a strengthened substrate. It should be noted that glass ceramic substrates may also be strengthened in the same manner as glass-based substrates. As used herein, the term "strengthened substrate" may refer to a glass-based substrate or a glass substrates that has been chemically strengthened, for example through ion-exchange of larger ions for smaller ions in the surface of the glass-based or glass substrate. However, as discussed above, thermal strengthening methods known in the art, such as thermal tempering or heat strengthening, may be utilized to form strengthened glass substrates. In some embodiments, the substrates may be strengthened using a combination of chemical strengthening processes and thermally strengthening processes.

In strengthened glass-based substrates, there is a stress profile in which there is a compressive stress (CS) on the surface and tension (central tension, or CT) in the center of the glass. According to one or more embodiments, the screen cover can be thermally strengthened, chemically strengthened, or a combination of thermally strengthened and chemically strengthened. As used herein, "thermally strengthened" refers to substrates that are heat treated to improve the strength of the substrate, and "thermally strengthened" includes tempered substrates and heat-strengthened substrates, for example tempered glass and heat-strengthened glass. Tempered glass involves an accelerated cooling process, which creates higher surface compression and/or edge compression in the glass. Factors that impact the degree of surface compression include the air-quench temperature, volume, and other variables that create a surface compression of at least 10,000 pounds per square inch (psi). Tempered glass is typically four to five times stronger than annealed or untreated glass. Heat-strengthened glass is produced by a slower cooling than tempered glass, which results in a lower compression strength at the surface and heat-strengthened glass is approximately twice as strong as annealed, or untreated, glass.

Examples of glasses that may be used in the core and cladding substrates may include alkali aluminosilicate glass compositions or alkali aluminoborosilicate glass compositions, though other glass compositions are contemplated. Such glass compositions may be characterized as ion exchangeable. As used herein, "ion exchangeable" means that a substrate comprising the composition is capable of exchanging cations located at or near the surface of the substrate with cations of the same valence that are either larger or smaller in size. One example glass composition comprises $SiO_2$, $B_2O_3$ and $Na_2O$, where $(SiO_2+B_2O_3) \geq 66$ mol. %, and $Na_2O \geq 9$ mol. %. Suitable glass compositions, in some embodiments, further comprise at least one of $K_2O$, MgO, and CaO. In a particular embodiment, the glass compositions used in the substrates can comprise 61-75 mol. % $SiO_2$; 7-15 mol. % $Al_2O_3$; 0-12 mol. % $B_2O_3$; 9-21 mol. % $Na_2O$; 0-4 mol. % $K_2O$; 0-7 mol. % MgO; and 0-3 mol. % CaO.

A further example glass composition suitable for the substrates comprises: 60-70 mol. % $SiO_2$; 6-14 mol. % $Al_2O_3$; 0-15 mol. % $B_2O_3$; 0-15 mol. % $Li_2O$; 0-20 mol. % $Na_2O$; 0-10 mol. % $K_2O$; 0-8 mol. % MgO; 0-10 mol. % CaO; 0-5 mol. % $ZrO_2$; 0-1 mol. % $SnO_2$; 0-1 mol. % $CeO_2$; less than 50 ppm $As_2O_3$; and less than 50 ppm $Sb_2O_3$; where 12 mol. % $\leq (Li_2O+Na_2O+K_2O) \leq 20$ mol. % and 0 mol. % $\leq (MgO+CaO) \leq 10$ mol. %.

A still further example glass composition suitable for the substrates comprises: 63.5-66.5 mol. % $SiO_2$; 8-12 mol. % $Al_2O_3$; 0-3 mol. % $B_2O_3$; 0-5 mol. % $Li_2O$; 8-18 mol. % $Na_2O$; 0-5 mol. % $K_2O$; 1-7 mol. % MgO; 0-2.5 mol. % CaO; 0-3 mol. % $ZrO_2$; 0.05-0.25 mol. % $SnO_2$; 0.05-0.5 mol. % $CeO_2$; less than 50 ppm $As_2O_3$; and less than 50 ppm $Sb_2O_3$; where 14 mol. % $\leq (Li_2O+Na_2O+1(20)) \leq 18$ mol. % and 2 mol. % $\leq (MgO+CaO) \leq 7$ mol. %.

In a particular embodiment, an alkali aluminosilicate glass composition suitable for the substrates comprises alumina, at least one alkali metal and, in some embodiments, greater than 50 mol. % $SiO_2$, in other embodiments at least 58 mol. % $SiO_2$, and in still other embodiments at least 60 mol. % $SiO_2$, wherein the ratio $((Al_2O_3+B_2O_3)/\Sigma \text{ modifiers}) > 1$, where in the ratio the components are expressed in mol. % and the modifiers are alkali metal oxides. This glass composition, in particular embodiments, comprises: 58-72 mol. % $SiO_2$; 9-17 mol. % $Al_2O_3$; 2-12 mol. % $B_2O_3$; 8-16 mol. % $Na_2O$; and 0-4 mol. % $K_2O$, wherein the ratio $((Al_2O_3+B_2O_3)/\Sigma \text{modifiers}) > 1$.

In still another embodiment, the substrates may include an alkali aluminosilicate glass composition comprising: 64-68 mol. % $SiO_2$; 12-16 mol. % $Na_2O$; 8-12 mol. % $Al_2O_3$; 0-3 mol. % $B_2O_3$; 2-5 mol. % $K_2O$; 4-6 mol. % MgO; and 0-5 mol. % CaO.

In an alternative embodiment, the substrates may comprise an alkali aluminosilicate glass composition comprising: 2 mol % or more of $Al_2O_3$ and/or $ZrO_2$, or 4 mol % or more of $Al_2O_3$ and/or $ZrO_2$.

The strengthened substrates described herein may be chemically strengthened by an ion exchange process. In the ion-exchange process, typically by immersion of a glass or glass ceramic substrate into a molten salt bath for a predetermined period of time, ions at or near the surface(s) of the glass or glass ceramic substrate are exchanged for larger metal ions from the salt bath. In one embodiment, the temperature of the molten salt bath is about 400-430° C. and the predetermined time period is about four to about twelve hours. The incorporation of the larger ions into the glass or glass ceramic substrate strengthens the substrate by creating a compressive stress in a near surface region or in regions at and adjacent to the surface(s) of the substrate. A corresponding tensile stress is induced within a central region or regions at a distance from the surface(s) of the substrate to balance the compressive stress. Glass or glass ceramic substrates utilizing this strengthening process may be described more specifically as chemically-strengthened or ion-exchanged glass or glass ceramic substrates.

In one example, sodium ions in a strengthened glass or glass ceramic substrate are replaced by potassium ions from the molten bath, such as a potassium nitrate salt bath, though other alkali metal ions having larger atomic radii, such as rubidium or cesium, can replace smaller alkali metal ions in the glass. According to particular embodiments, smaller alkali metal ions in the glass or glass ceramic can be replaced by Ag+ ions to provide an antimicrobial effect. Similarly, other alkali metal salts such as, but not limited to, sulfates, phosphates, halides, and the like may be used in the ion exchange process.

In strengthened glass-based substrates, there is a stress profile in which there is a compressive stress (CS) on the surface and tension (central tension, or CT) in the center of the glass. The replacement of smaller ions by larger ions at a temperature below that at which the glass network can relax produces a distribution of ions across the surface(s) of the strengthened substrate that results in a stress profile. The larger volume of the incoming ion produces a compressive stress (CS) on the surface and tension (central tension, or CT) in the center of the strengthened substrate. Compressive stress (including surface CS) is measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety. In one or more embodiments, the glass-based substrate used for the core and/or cladding can have a surface compressive stress of 750 MPa or greater, e.g., 800 MPa or greater, 850 MPa or greater, 900 MPa or greater, 950 MPa or greater, 1000 MPa or greater, 1150 MPa or greater, or 1200 MPa.

As used herein, DOL means the depth at which the stress in the chemically strengthened alkali aluminosilicate glass article described herein changes from compressive to tensile. DOL may be measured by FSM or or a scattered light polariscope (SCALP) depending on the ion exchange treatment. Where the stress in the glass article is generated by exchanging potassium ions into the glass article, FSM is used to measure DOL. Where the stress is generated by exchanging sodium ions into the glass article, SCALP is used to measure DOL. Where the stress in the glass article is generated by exchanging both potassium and sodium ions into the glass, the DOL is measured by SCALP, since it is believed the exchange depth of sodium indicates the DOL and the exchange depth of potassium ions indicates a change in the magnitude of the compressive stress (but not the change in stress from compressive to tensile); the exchange depth of potassium ions in such glass articles is measured by FSM.

Refracted near-field (RNF) method or SCALP may be used to measure the stress profile. When the RNF method is utilized to measure the stress profile, the maximum CT value provided by SCALP is utilized in the RNF method. In particular, the stress profile measured by RNF is force balanced and calibrated to the maximum CT value provided by a SCALP measurement. The RNF method is described in U.S. Pat. No. 8,854,623, entitled "Systems and methods for measuring a profile characteristic of a glass sample", which is incorporated herein by reference in its entirety. In particular, the RNF method includes placing the glass article adjacent to a reference block, generating a polarization-switched light beam that is switched between orthogonal polarizations at a rate of between 1 Hz and 50 Hz, measuring an amount of power in the polarization-switched light beam and generating a polarization-switched reference signal, wherein the measured amounts of power in each of the orthogonal polarizations are within 50% of each other. The method further includes transmitting the polarization-switched light beam through the glass sample and reference block for different depths into the glass sample, then relaying the transmitted polarization-switched light beam to a signal photodetector using a relay optical system, with the signal photodetector generating a polarization-switched detector signal. The method also includes dividing the detector signal by the reference signal to form a normalized detector signal and determining the profile characteristic of the glass sample from the normalized detector signal.

In one or more embodiments, glass compositions described in United States Patent Application Publication No. 20150239775 may be utilized to manufacture glass substrates as described herein. United States Patent Application Publication No. 20150239775 describes glass articles having a compressive stress profile including two linear portions: the first portion extending from the surface to a relatively shallow depth and having a steep slope; and a second portion extending from the shallow depth to the depth of compression.

Ion exchange processes are typically carried out by immersing a glass-based article in a molten salt bath containing the larger ions to be exchanged with the smaller ions in the glass. It will be appreciated by those skilled in the art that parameters for the ion exchange process, including, but not limited to, bath composition and temperature, immersion time, the number of immersions of the glass in a salt bath (or baths), use of multiple salt baths, and additional steps such as annealing, washing, and the like, are generally determined by the composition of the glass and the desired depth of layer and compressive stress of the glass that result from the strengthening operation. By way of example, ion exchange of alkali metal-containing glasses may be achieved by immersion in at least one molten bath containing a salt such as, but not limited to, nitrates, sulfates, and chlorides of the larger alkali metal ion. The temperature of the molten salt bath typically is in a range from about 380° C. up to about 450° C., while immersion times range from about 15 minutes up to about 40 hours. However, temperatures and immersion times different from those described above may also be used.

In addition, non-limiting examples of ion exchange processes in which glass is immersed in multiple ion exchange baths, with washing and/or annealing steps between immersions, are described in U.S. Pat. No. 8,561,429, by Douglas C. Allan et al., issued on Oct. 22, 2013, entitled "Glass with Compressive Surface for Consumer Applications," and claiming priority from U.S. Provisional Patent Application No. 61/079,995, filed Jul. 11, 2008, in which glass is strengthened by immersion in multiple, successive, ion exchange treatments in salt baths of different concentrations; and U.S. Pat. No. 8,312,739, by Christopher M. Lee et al., issued on Nov. 20, 2012, and entitled "Dual Stage Ion Exchange for Chemical Strengthening of Glass," and claiming priority from U.S. Provisional Patent Application No. 61/084,398, filed Jul. 29, 2008, in which glass is strengthened by ion exchange in a first bath is diluted with an effluent ion, followed by immersion in a second bath having a smaller concentration of the effluent ion than the first bath. The contents of U.S. Pat. Nos. 8,561,429 and 8,312,739 are incorporated herein by reference in their entirety.

The compressive stress is created by chemically strengthening the glass-based article, for example, by the ion exchange processes previously described herein, in which a plurality of first metal ions in the outer region of the glass-based article is exchanged with a plurality of second metal ions so that the outer region comprises the plurality of the second metal ions. Each of the first metal ions has a first ionic radius and each of the second alkali metal ions has a second ionic radius. The second ionic radius is greater than the first ionic radius, and the presence of the larger second alkali metal ions in the outer region creates the compressive stress in the outer region.

At least one of the first metal ions and second metal ions are ions of an alkali metal. The first ions may be ions of lithium, sodium, potassium, and rubidium. The second metal ions may be ions of one of sodium, potassium, rubidium, and cesium, with the proviso that the second alkali metal ion has an ionic radius greater than the ionic radius than the first alkali metal ion.

Figure 17B:
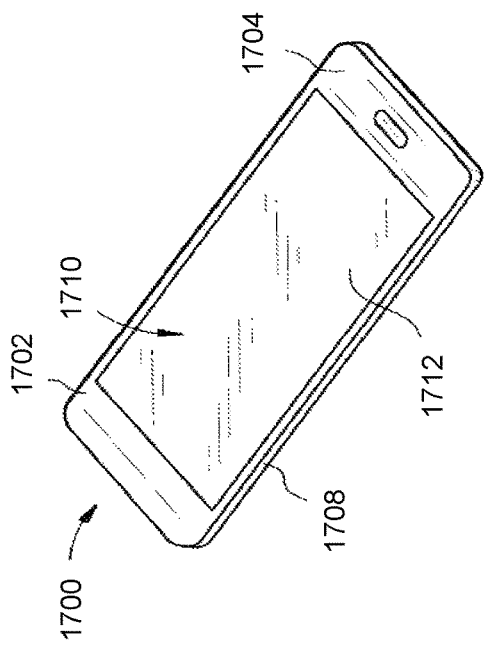
FIG. 17B is a perspective view of the exemplary electronic device of FIG. 17A.
Figure 17A:
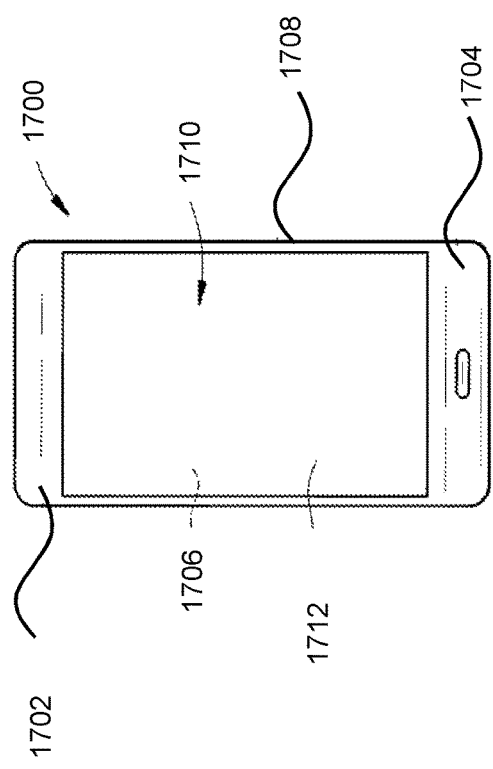
FIG. 17A is a plan view of an exemplary electronic device incorporating any of the coated-glass based articles disclosed herein.

The coated glass-based articles disclosed herein may be incorporated into another article such as an article with a display (or display articles) (e.g., consumer electronics, including mobile phones, tablets, computers, navigation systems, and the like), architectural articles, transportation articles (e.g., automotive, trains, aircraft, sea craft, etc.), appliance articles, or any article that requires some transparency, scratch-resistance, abrasion resistance or a combination thereof. An exemplary article incorporating any of the coated glass-based articles disclosed herein is shown in FIGS. 17A and 17B. Specifically, FIGS. 17A and 17B show a consumer electronic device 1700 including a housing 1702 having front 1704, back 1706, and side surfaces 1708; electrical components (not shown) that are at least partially inside or entirely within the housing and including at least a controller, a memory, and a display 1710 at or adjacent to the front surface of the housing; and a cover substrate 1712 at or over the front surface of the housing such that it is over the display. In some embodiments, the cover substrate 1712 may include any of the coated glass-based articles disclosed herein. While the foregoing is directed to various embodiments, other and further embodiments of the disclosure may be devised without departing from the basic scope thereof, and the scope thereof is determined by the claims that follow.

What is claimed is:

1. A glass-based article comprising:
a glass-based substrate having a first surface and a second surface opposing the first surface defining a substrate thickness (t) in a range of about 0.1 millimeters to 3 millimeters, the glass-based substrate having a compressive region having a first compressive stress CS maximum at the first surface of the glass-based article extending to a depth of compression (DOC) and second local CS maximum at a depth of at least 25 μm from the first surface,
wherein the glass-based substrate comprises a chemically strengthened glass-based core substrate having a first side and a second side, the glass-based core substrate sandwiched between a glass-based first cladding substrate and a glass-based second cladding substrate, the first cladding substrate and second cladding substrate directly bonded to the first side and the second cladding substrate directly bonded to the second side.

2. The glass-based article of claim 1, wherein the glass-based article has a thickness in a range of 0.1 mm and 2 mm.

3. The glass-based article of claim 1, wherein the second local CS maximum is at a depth of at least 50 μm from the first surface.

4. The glass-based article of claim 3, wherein the second CS maximum is at a depth of at least 75 μm from the first surface.

5. The glass-based article of claim 3, wherein the second CS maximum is at a depth of at least 100 μm from the first surface.

6. The glass-based article of claim 1, wherein the core substrate comprises a first glass composition and the first cladding substrate and the second cladding substrate each comprises a second glass composition, wherein the first glass composition is different from the second glass composition.

7. The glass-based article of claim 6, wherein the first glass composition has a first ion diffusivity and the second glass composition has a second ion diffusivity, and the first ion diffusivity and second ion diffusivity are different.

8. The glass-based article of claim 7, wherein the first glass composition has a first coefficient of thermal expansion (CTE) and the second glass composition has a second coefficient of thermal expansion (CTE), and the first CTE and second CTE are different.

9. The glass-based article of claim 8, wherein the second CTE is lower than the first CTE to impart a compressive stress in the first cladding substrate and second cladding substrate.

10. The glass-based article of claim 6, wherein the core substrate has a first stress profile and the first cladding substrate and second cladding substrate each has a second stress profile, wherein the first stress profile is different from the second stress profile.

11. The glass-based article of claim 6, wherein the first glass composition has a first Young's modulus value and the second glass composition has a second Young's modulus value, and the first Young's modulus value and second Young's modulus value are different.

12. The glass-based article of claim 1, wherein the first cladding substrate and the second cladding substrate are each bonded to the core substrate by covalent bonding.

13. The glass-based article of claim 12, wherein the covalent bonding comprises a Si—O—Si bond.

14. The glass-based article of claim 1, wherein the first cladding substrate and the second cladding substrate each has a thickness in a range of 25 μm and 150 μm.

15. The glass-based article of claim 1, wherein the first cladding substrate and the second cladding substrate each has a thickness in a range of 50 μm and 150 μm.

16. The glass-based article of claim 1, wherein the first cladding substrate and the second cladding substrate each has a thickness in a range of 50 μm and 100 μm.

17. The glass-based article of claim 1, wherein the first cladding substrate and the second cladding substrate each has a thickness in a range of 50 μm and 75 μm.

18. The glass-based article of claim 1, wherein the first cladding substrate and the second cladding substrate each has a thickness in a range of 25 μm and 75 μm.

19. A consumer electronic product, comprising:
a housing having a front surface, a back surface and side surfaces;
electrical components provided at least partially within the housing, the electrical components including at least a controller, a memory, and a display, the display being provided at or adjacent the front surface of the housing; and
the glass-based article of claim 1.

20. A glass-based article comprising:
a glass-based substrate having a first surface and a second surface opposing the first surface defining a substrate thickness (t) in a range of about 0.1 millimeters to 3 millimeters, the glass-based substrate having a compressive region having a first compressive stress CS maximum at the first surface of the glass-based article extending to a depth of compression (DOC) and second local CS maximum at a depth of at least 25 μm from the first surface,
wherein the glass-based substrate comprises a glass-based core substrate having a first side and a second side, the glass-based core substrate sandwiched between a glass-based first cladding substrate and a glass-based second cladding substrate, the first cladding substrate and second cladding substrate directly bonded to the first side and the second cladding substrate directly bonded to the second side,
wherein the core substrate comprises a first glass composition and the first cladding substrate and the second cladding substrate each comprises a second glass composition, wherein the first glass composition is different from the second glass composition, and
further wherein the core substrate has a first stress profile and the first cladding substrate and second cladding substrate each has a second stress profile, wherein the first stress profile is different from the second stress profile.

* * * * *